(12) United States Patent
Phang et al.

(10) Patent No.: US 9,041,046 B2
(45) Date of Patent: May 26, 2015

(54) METHOD AND APPARATUS FOR A LIGHT SOURCE

(71) Applicant: Avago Technologies General IP (Singapore) Pte. Ltd., Singapore (SG)

(72) Inventors: Chin Ewe Phang, Penang (MY); Seong Choon Lim, Penang (MY); Eng Chuan Ong, Penang (MY)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 13/664,278

(22) Filed: Oct. 30, 2012

(65) Prior Publication Data

US 2013/0050982 A1    Feb. 28, 2013

Related U.S. Application Data

(63) Continuation-in-part of application No. 13/363,926, filed on Feb. 1, 2012, which is a continuation-in-part of application No. 13/048,136, filed on Mar. 15, 2011.

(51) Int. Cl.
*H01L 33/50* (2010.01)
*H01L 33/52* (2010.01)
(Continued)

(52) U.S. Cl.
CPC ............. *H01L 33/52* (2013.01); *H01L 25/0753* (2013.01); *H01L 33/486* (2013.01); *H01L 33/507* (2013.01); *H01L 33/508* (2013.01);
(Continued)

(58) Field of Classification Search
CPC ...................................................... H01L 33/50

USPC ..................... 257/98, E33.061; 362/84
See application file for complete search history.

(56) References Cited

U.S. PATENT DOCUMENTS 6,635,987 B1    10/2003   Wojnarowski et al.
6,791,116 B2    9/2004    Takahashi et al.
(Continued)

FOREIGN PATENT DOCUMENTS

CN    101699638       4/2010
JP    2007-042687     2/2007
(Continued)

OTHER PUBLICATIONS

"LED WorkLitE (Si4)", http://www.scorpio.hu/download/LED_Worklite_SI4.pdf.
(Continued)

*Primary Examiner* — Matthew W Such
*Assistant Examiner* — Warren H Kilpatrick

(57) ABSTRACT

A light-emitting device having a light source die mounted within an aperture is disclosed. The aperture is covered by a die attach pad on one side. The light source die is mounted on a die attach pad within the aperture. In one embodiment, an optical coupling layer can be formed within an aperture encapsulating a light source die. A wavelength converting layer can be formed on the substrate above the optical coupling layer. The wavelength converting layer can comprise a high density layer and a low density layer. The high density layer can comprise wavelength-converting material precipitated on one side of the wavelength converting layer. The low density layer can comprise the wavelength-converting material in particle form suspended within the wavelength converting layer. In one embodiment, the wavelength converting layer may be confined within the aperture of the substrate.

20 Claims, 17 Drawing Sheets

(51) Int. Cl.
*H01L 33/48* (2010.01)
*H01L 25/075* (2006.01)
*H01L 33/60* (2010.01)

(52) U.S. Cl.
CPC ......... *H01L 33/60* (2013.01); *H01L 2933/0041* (2013.01); *H01L 2933/005* (2013.01); *H01L 2224/48091* (2013.01); *H01L 2224/48227* (2013.01); *H01L 2224/8592* (2013.01); *G03B 2215/0567* (2013.01)

(56) References Cited

U.S. PATENT DOCUMENTS

| | | | |
|---|---|---|---|
| 7,217,583 B2 | 5/2007 | Negley et al. | |
| 7,955,878 B2 | 6/2011 | Harada | |
| 8,089,085 B2 | 1/2012 | Shi | |
| 2003/0143771 A1 | 7/2003 | Kidoguchi et al. | |
| 2005/0224818 A1 | 10/2005 | Harada | |
| 2006/0073625 A1 | 4/2006 | Harada | |
| 2008/0037252 A1 | 2/2008 | Nii et al. | |
| 2008/0105888 A1* | 5/2008 | Wang et al. | 257/98 |
| 2008/0137106 A1 | 6/2008 | Ono | |
| 2008/0173884 A1 | 7/2008 | Chitnis et al. | |
| 2008/0191232 A1 | 8/2008 | Lee et al. | |
| 2008/0191620 A1 | 8/2008 | Moriyama et al. | |
| 2009/0020774 A1* | 1/2009 | Park | 257/98 |
| 2009/0065791 A1 | 3/2009 | Yen et al. | |
| 2009/0231833 A1 | 9/2009 | Miki et al. | |
| 2010/0025709 A1 | 2/2010 | Koseki et al. | |
| 2010/0099208 A1 | 4/2010 | Harada | |
| 2010/0155755 A1 | 6/2010 | Dong | |
| 2010/0193825 A1* | 8/2010 | Yang | 257/99 |
| 2011/0045619 A1 | 2/2011 | Ling | |
| 2011/0156071 A1* | 6/2011 | Cheng et al. | 257/98 |
| 2011/0163681 A1 | 7/2011 | Dau | |
| 2011/0227108 A1 | 9/2011 | Tetz et al. | |
| 2011/0242806 A1 | 10/2011 | Ramer | |
| 2011/0309398 A1 | 12/2011 | Ito et al. | |
| 2012/0236582 A1 | 9/2012 | Waragaya | |
| 2013/0033168 A1 | 2/2013 | Hsieh et al. | |
| 2013/0200413 A1 | 8/2013 | Kashiwagi et al. | |
| 2014/0054634 A1 | 2/2014 | Fukuda et al. | |
| 2014/0145584 A1 | 5/2014 | Lim et al. | |
| 2014/0151732 A1 | 6/2014 | Fukuda et al. | |
| 2014/0175488 A1 | 6/2014 | Kashiwagi et al. | |

FOREIGN PATENT DOCUMENTS

| | | | |
|---|---|---|---|
| WO | WO-2010-038097 | 4/2010 | |
| WO | WO 2010074371 A1 * | 7/2010 | ............... H01L 33/64 |

OTHER PUBLICATIONS

"Phosphor, Diffuser, Silicone and Epoxy Material Dispensing", <http://www.nordson.com/en-us/divisions/asymtek/solutions/LED-Assembly/Pages/Phosphor-Diffuser-Silicone-and-Epoxy-Material-Dispensing.aspx>, 2012.

"LED WorkLitE (Si4)", http://www.scorpio.hu/download/LED_Worklite_S14.pdf.

"Phosphor, Diffuser, Silicone and Epoxy Material Dispensing", <http://www.nordson.com/en-us/divisions/asymtek/solutions/LED-Assembly/Pages/Phosphor-Diffuser-Silicone-and-Epoxy-Material-Dispensing.aspx>.

Liu, Zongyuan et al., "Effects of Phosphor's Location on LED Packaging Performance", *IEEE; International Conference on Electronic Packaging Technology & High Density Packaging* 2008.

Official Action for U.S. Appl. No. 13/686,912, mailed Mar. 13, 2014.
Official Action for U.S. Appl. No. 13/686,912, mailed Aug. 1, 2014.
Official Action for U.S. Appl. No. 13/363,926, mailed Jan. 8, 2015 14 pages.

* cited by examiner

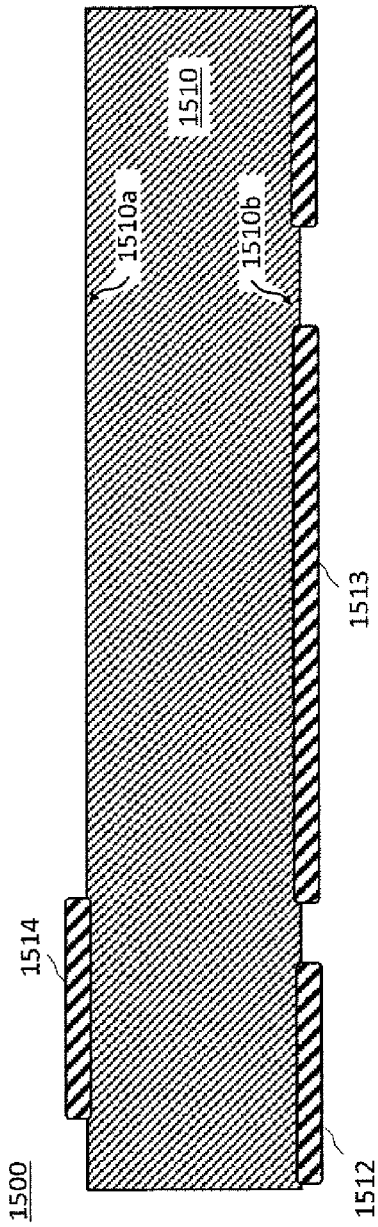
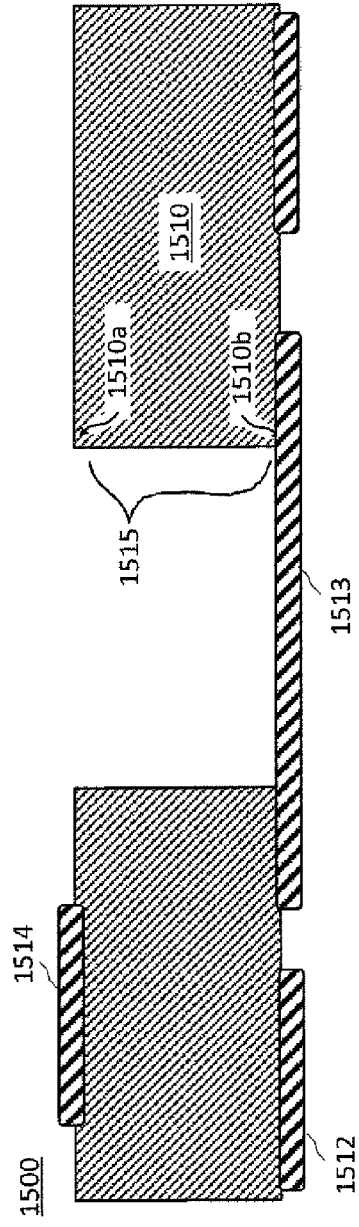
FIG. 15A
FIG. 15B

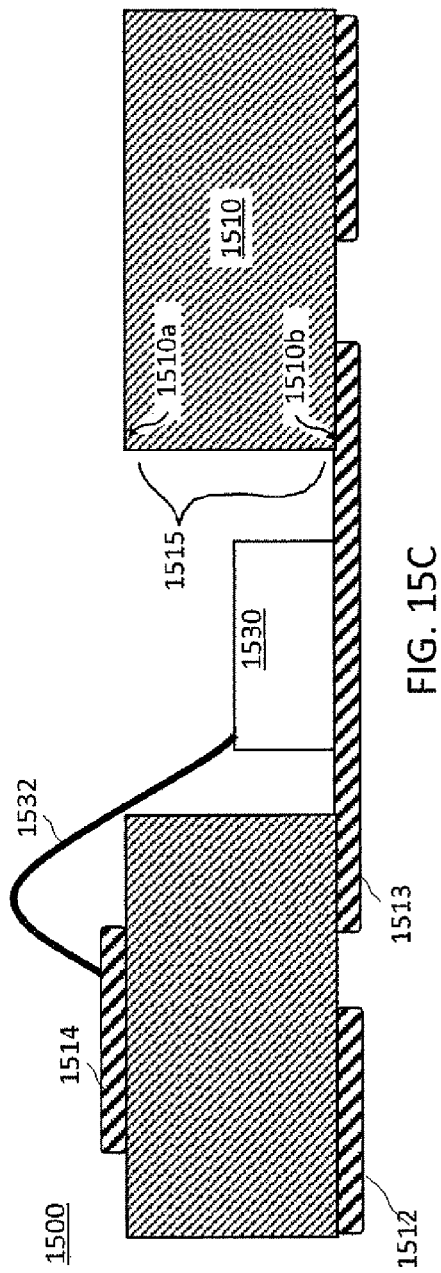
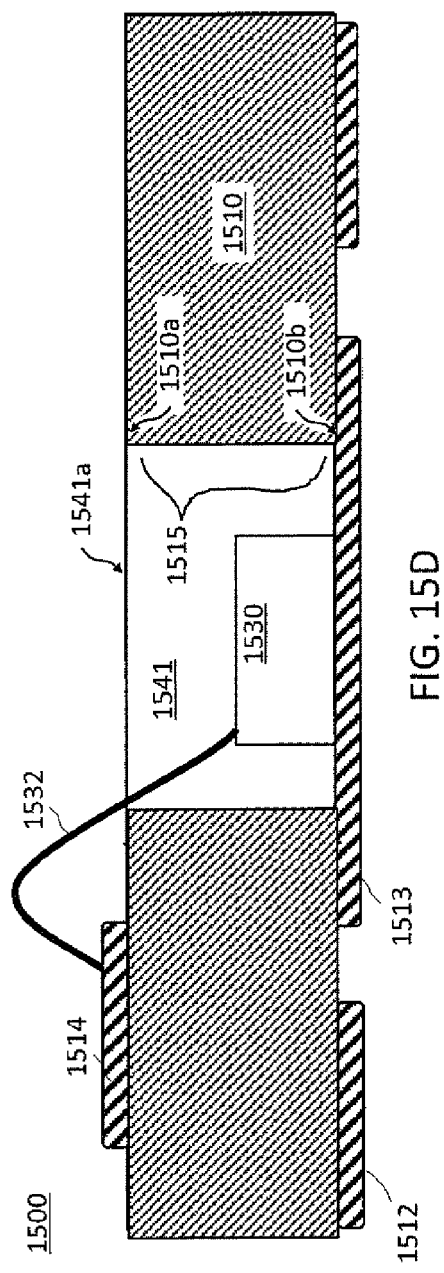
FIG. 15C
FIG. 15D

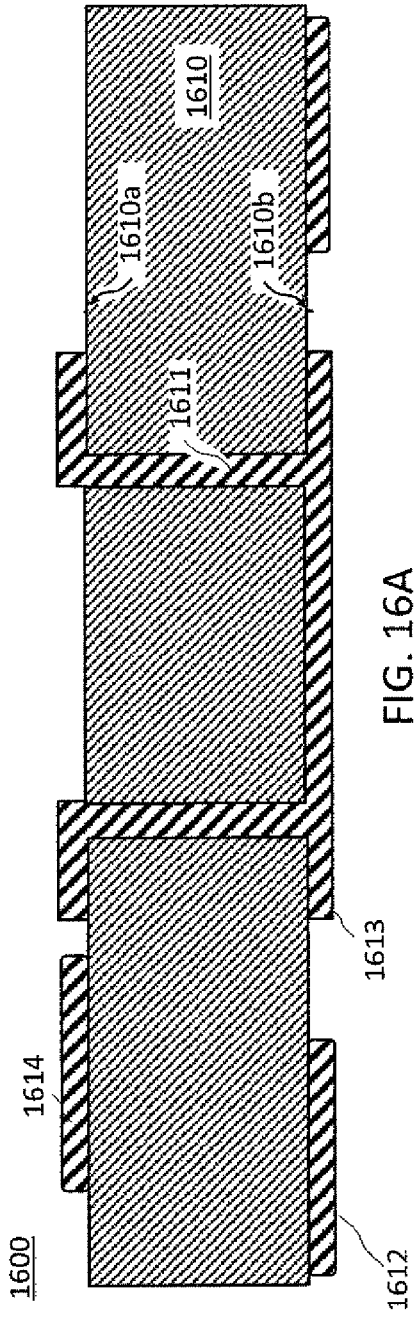
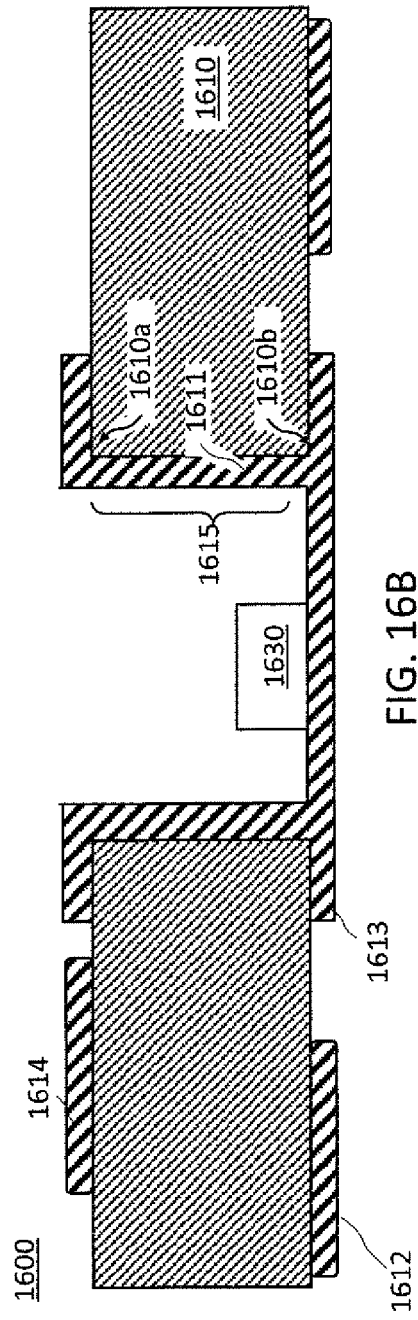

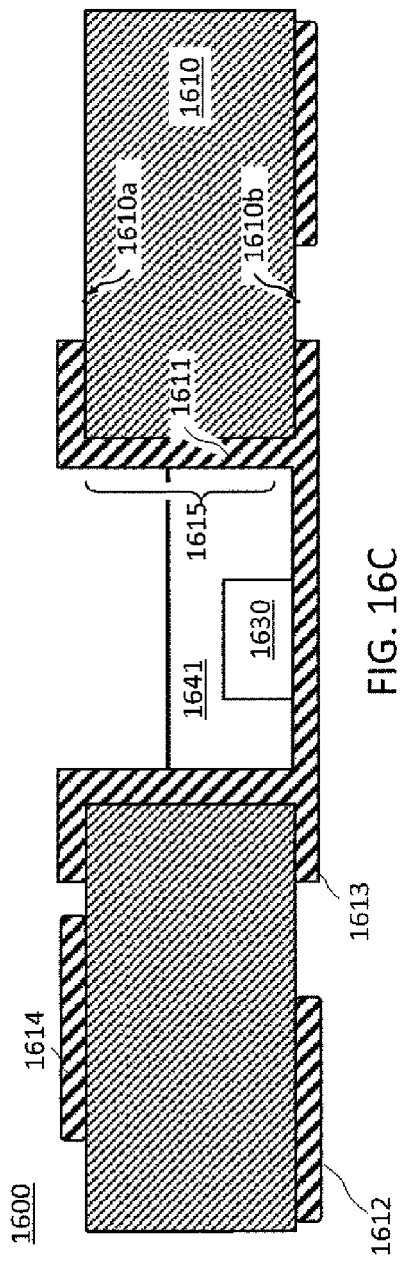
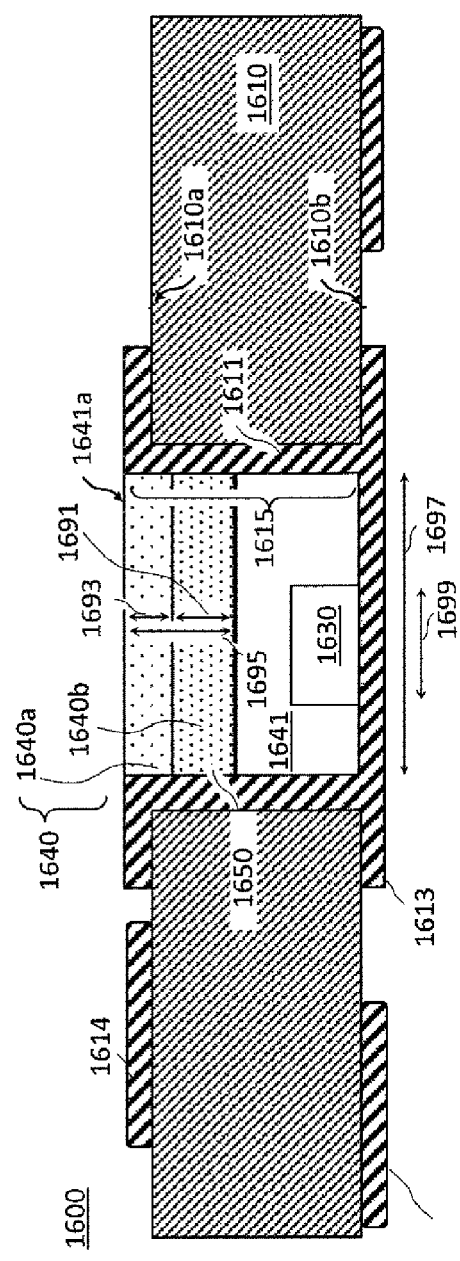
FIG. 16C
FIG. 16D

1

METHOD AND APPARATUS FOR A LIGHT SOURCE

This is a continuation-in-part of U.S. application Ser. No. 13/363,926 filed on Feb. 1, 2012, which in turn is a continuation-in-part of U.S. application Ser. No. 13/048,136 filed on Mar. 15, 2011. The U.S. application Ser. No. 13/363,926 and U.S. application Ser. No. 13/048,136 are incorporated by reference herein.

BACKGROUND

Light-emitting diodes (referred to hereinafter as LEDs) represent one of the most popular light-emitting devices today. Due to the small form factor and low power consumption, LEDs are widely used in electronic mobile devices as indicator lights, light sources for Liquid Crystal Displays or LCDs, as well as flashes in camera phones, digital cameras and video recording devices. Compared to Xenon flashes used in most cameras, LEDs are superior in terms of size and power consumption. For example, an LED in a flash application may have a thickness of 0.6 mm compared to Xenon flashes that has a thickness of 1.3 mm. The small form factor makes LEDs suitable in mobile camera devices or mobile phones with a camera feature that may have an overall thickness less than 5 mm. In addition, unlike Xenon flashes, LEDs do not require charging time before use.

Generally, most light-emitting devices are not made for a single application, but for multiple applications. The light-emitting devices used in flashes are usually high power and high output light sources. Therefore, other suitable applications for light-emitting devices used in flashes are high power applications, such as indicator lights, light sources used in lighting fixtures or light sources used in infotainment displays. Electronic infotainment display systems are usually large-scale display systems, which may be found in stadiums, discotheques, electronic traffic sign displays and infotainment billboards along streets and roadways. Electronic infotainment displays may be configured to display text, graphics, images or videos containing information or entertainment contents.

Most of the flashes used today are white light sources. However, light produced by light source dies in most LEDs are generally a narrow banded light having a peak wavelength ranging from ultra violet to green wavelength. The output of the light source die is then typically converted to a broad spectrum white light by means of a wavelength-converting material. One example of a wavelength-converting material is phosphor. The wavelength-converting material may absorb a portion of light, resulting in light loss. The light lost is usually not substantial, but may be significant if the wavelength-converting material is thick.

There are several design considerations in designing a light-emitting device, such as viewing angle, color point, heat dissipation, power consumption and form factor, to name a few. Generally light-emitting devices are designed giving priority to design considerations in a primary application. For example, the light-emitting devices targeted for a flash application in camera devices tend to be small in form factor and have a high light output. However, light-emitting devices can often be used outside the targeted, primary application.

BRIEF DESCRIPTION OF THE DRAWINGS

Illustrative embodiments by way of examples, not by way of limitation, are illustrated in the drawings. Throughout the description and drawings, similar reference numbers may be used to identify similar elements. The drawings are for illustrative purpose and may not be drawn per actual scale.

FIGS. 15A-15E illustrate a light-emitting device with a substrate having an aperture;

FIGS. 16A-16E illustrate a light-emitting device with wavelength converting material disposed within the aperture.

DETAILED DESCRIPTION

Figure 1:
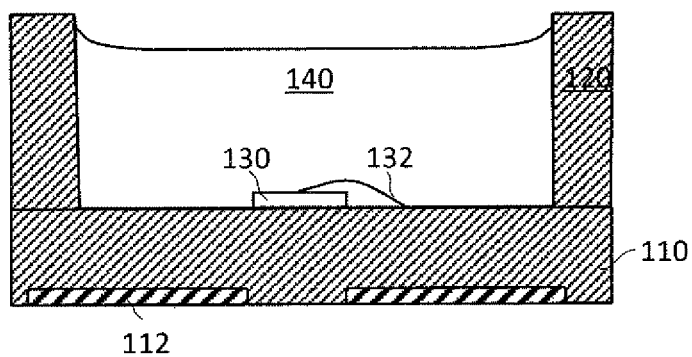
FIG. 1 illustrates a cross-sectional view of a light-emitting device having sidewalls.

FIG. 1 illustrates a cross-sectional view of a light-emitting device 100. The light-emitting device 100 comprises a substrate 110, connector pads 112, a body 120, a light source die 130, a wire bond 132 bonding the die 130 to the substrate 110, and an encapsulant 140. The encapsulant 140 encapsulates the light source die 130 and the wire bond 132. The body 120 defines side walls configured to direct light from the light-emitting device. Due to the intermolecular forces that holds the liquid together when the encapsulant 140 is in a liquid-form during the manufacturing process, the top surface of the encapsulant 140 may not be completely flat. The body 120 may be molded. While the body 120 may increase the reliability performance, the body 120 occupies substantial space that may be otherwise reduced.

Figure 2:
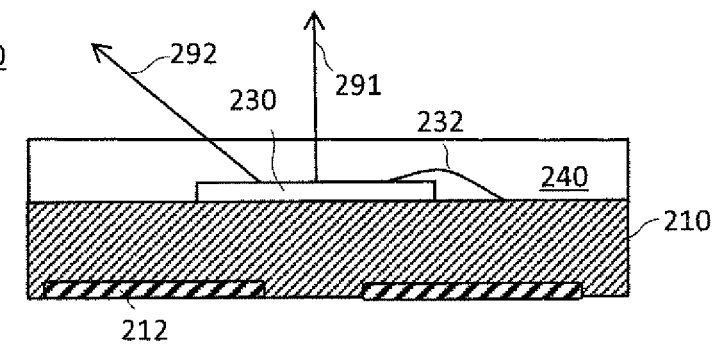
FIG. 2 illustrates a cross-sectional view of a light-emitting device without sidewalls manufactured using a transfer mold process.

FIG. 2 illustrates a light-emitting device 200 without sidewalls manufactured by means of a transfer mold process. The light-emitting device 200 comprises a substrate 210, connector pads 212, a light source die 230, a wire bond 232 bonding the die 230 to the substrate 210, and an encapsulation layer 240. The encapsulation layer 240 may be formed from a B-stage encapsulant mixed with a wavelength-converting material (not shown). A B-stage encapsulant is an intermediate stage in the reaction of certain thermosetting resins, in which the material softens when heated, and swells when in contact with certain liquids, but the material may not entirely fuse or dissolve. The wavelength-converting material (not shown) is distributed substantially evenly in the encapsulation layer 240. The wavelength-converting-material (not shown) may cause light loss as a portion of light may be absorbed. The encapsulation layer 240 may be required to have a certain thickness, in order to enable the functionality of the encapsulation layer 240 to protect the light source die 230 from moisture and vibration. However, the light loss may become significant, as the thickness of encapsulation layer 240 is increased.

Figure 3:
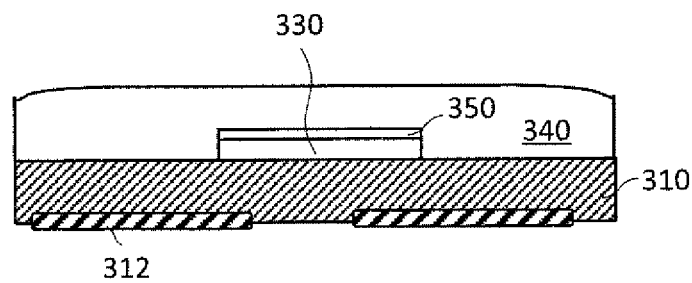
FIG. 3 illustrates a cross-sectional view of a light-emitting device having a layer of wavelength-converting material coated on the light source die.

An effective way to reduce light loss is by using a thin layer of light-converting material 350, as shown in FIG. 3, which illustrates a cross-sectional view of a light-emitting device 300 comprising a substrate 310, connector pads 312, a light source die 330, a thin layer of wavelength-converting material 350 coated on the light source die 330, and an encapsulation layer 340. The encapsulation layer 340 encapsulates the light source die 330 and the thin layer of wavelength-converting material 350. The wavelength-converting material 350 may be attached to an upper relatively flat surface of the light source die 330. Therefore, the light source die 330 is usually a flip chip die. The encapsulation layer 340 may be formed using a spin molding or a spinning process. The encapsulation layer 340 may not be flat. In addition, the spin molding process may not be cost effective.

Figure 4A:
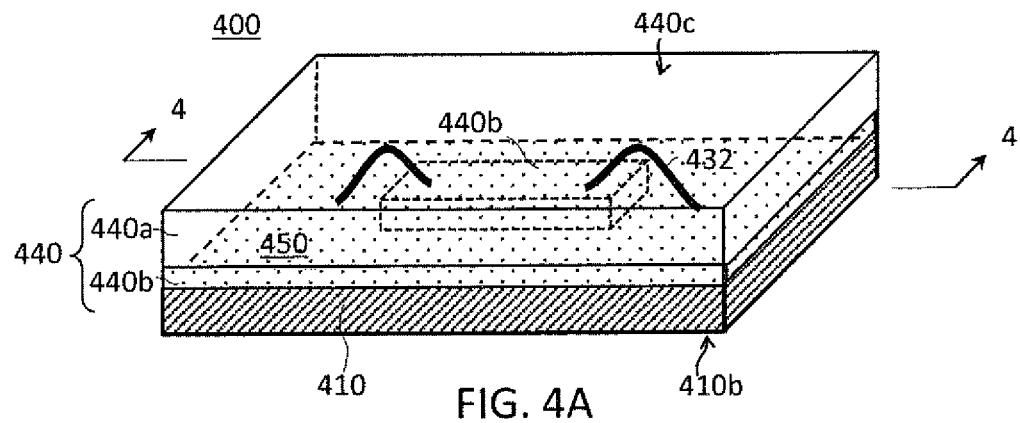
FIG. 4A illustrates a perspective view of a light-emitting device manufactured using a group casting method.
Figure 4B:
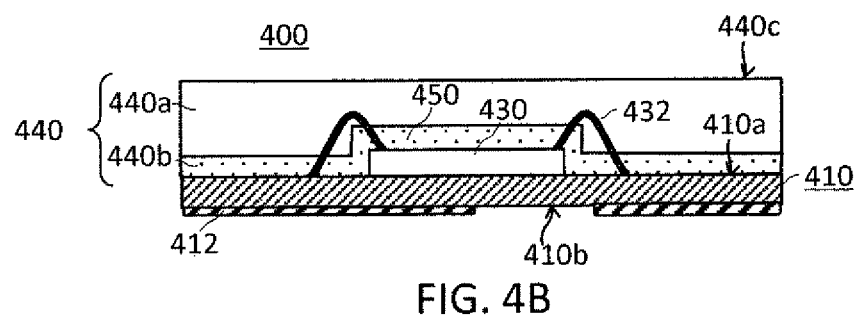
FIG. 4B illustrates a cross-sectional view of the light-emitting device shown in FIG. 4A taken along line 4-4.

One cost effective method for manufacturing a miniature light-emitting device with minimum light loss and a flat top surface is to use a group casting method. FIG. 4A illustrates a perspective view of light-emitting device 400. FIG. 4B shows a cross-sectional view of the light-emitting device 400 along line 4-4, shown in FIG. 4A. Referring to FIGS. 4A and 4B, the light-emitting device 400 comprises a substrate 410, connector pads 412, a light source die 430, a wire bond 432 connecting the die 430 to the substrate 410, an encapsulation layer 440 encapsulating the light source die 430 and the wire bond 432, and a wavelength-converting material 450.

The substrate 410 is substantially flat with an upper surface 410a and a bottom surface 410b. The substrate 410 may be a printed circuit board (referred herein after as PCB). The bottom surface 410b may further comprise connector pads 412. The connector pads 412 may extend from one side of the substrate 410, as shown in FIG. 4B. The connector pads 412 may be connected to an external power source (not shown) for providing power to the light-emitting device 400. The connector pad 412 may be connected to a die attach pad (not shown) through one or a plurality of conducting material(s), typically referred to as a "via" (not shown), extending from the bottom surface 410b to the top surface 410a of the substrate. The "vias", connector pads 412 and die attach pads may function as heat dissipation vehicles, dissipating heat generated by the light source die 430 to the surroundings.

The light source die 430 is configurable to emit light. For example, the light source die 430 may be a semiconductor based LED die, such as a Gallium Nitride (GaN) die, Indium Gallium Nitride (InGaN), or any other similar die configurable to produce light having a peak wavelength ranging between 300 nm and 520 nm. The light emitted by the light source die 430 is then converted into broad-spectrum white light by the wavelength-converting material 450. The wavelength-converting material 450 may be yellow phosphor, red phosphor, green phosphor, orange phosphor or any other material capable of converting a narrow banded peak-wavelength light into broad spectrum white light.

Figure 4C:
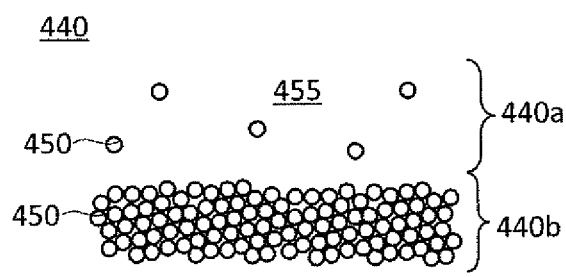
FIG. 4C illustrates density of the wavelength-converting material in the encapsulation layer of the light-emitting device shown in FIGS. 4A and 4B.

Due to manufacturing methods, the encapsulation layer 440 may further comprise a low density layer 440a and a high density layer 440b, which is further illustrated in FIG. 4C. The encapsulation layer 440 may formed by mixing wavelength-converting material 450 into an encapsulant 455 in liquid-form during the manufacturing process, and subsequently the mixture is allow to precipitate. The precipitation process may occur simultaneously during the curing process when the liquid encapsulant is cured into solid form. The encapsulant 455 may be epoxy, silicon or any other similar material. The high density layer 440b is formed by a layer of precipitated wavelength-converting material 450, as shown in FIG. 4C. The low density layer 440a, on the other hand, is not completely void of wavelength-converting material 450, but having very low density of the wavelength-converting material 450 suspended within the encapsulant 455 in particle form. The details of the manufacturing process are further discussed with reference to FIGS. 7A-7H and FIG. 8.

Unlike the light-emitting device 200, shown in FIG. 2, the encapsulant 455 used during the mixing process is in A-stage. A-stage is an early stage in the reaction of certain thermosetting resins in which the material is fusible and still soluble in certain liquids. As the encapsulant 455 is in A-stage, the wavelength-converting material 450 can be precipitated on one side. This process defines the encapsulation layer 440 into the low density layer 440a and the high density layer 440b. As the wavelength-converting material 450 is a thin layer, light loss due to the wavelength-converting material 450 is minimal. In the embodiment shown in FIG. 4B, the high density layer is in direct contact with the top surface 410a of the substrate 410. However, in other embodiments, the arrangement may be reversed such that the low density layer 440a is in direct contact with the top surface 410a of the substrate 410. The arrangement of low density layer 440a and the high density layer 440b depends on the orientation of the substrate 410 during manufacturing process as discussed further with reference to FIG. 8.

As shown in the embodiment in FIG. 4B, the wire bonds 432 are encapsulated in the encapsulation layer 440. However, a portion of the wire bond 432 is encapsulated within the high density layer 440b, while the remaining portion of the wire bond 432 is encapsulated within the low density layer 440a. In yet another embodiment, the entire wire bond 432 may be enclosed within only one of either the high density layer 440b or the low density layer 440a.

As shown in FIG. 4A, the light-emitting device 400 defines a rectangular shape. The substrate 410 and the encapsulation layer 440 are both rectangular shapes overlapping each other completely. In the embodiment shown in FIG. 4A, each of the substrate 410 and the encapsulation layer 440 have four sides respectively, which are aligned to each other, respectively. In yet another embodiment that the light-emitting device 400 may define a flat disc shape, with each of the substrate 410 and the encapsulation layer 440 having similar discs that are aligned with each other.

The top surface 440c of the encapsulation layer 440 defines a substantially flat surface without any meniscus. A meniscus is a curve in the upper surface of a standing liquid, produced in response to the surface of the container of the liquid such as the mold used to form the encapsulation layer 440. A meniscus can be either convex or concave. Due to the group casting method, discussed more fully with reference to FIG. 8 below, meniscus can be eliminated by means of a dummy area 745, as shown in FIG. 7H and discussed with reference to FIG. 8 below. This is one of the advantages of the light-emitting device 400 compared to the light-emitting device 300 shown in FIG. 3 in which the encapsulant 340 is formed individually.

Generally, both the low density layer 440a and the high density layer 440b may be substantially flat and planarly parallel to the substrate 410. However, in the embodiment shown in FIGS. 4A-4B, the high density layer 440b may not be completely flat. A portion of the high density layer 440b may be enclosing and thus defining the shape of the light source die 430. In one embodiment, the substrate 410 has a thickness of approximately 0.1 mm, the high density layer 440b has a thickness of approximately 0.25 mm and the low density layer is approximately 0.35 mm. The light source die 430 has a thickness of approximately 0.15 mm. The overall thickness of the light-emitting device 400 is approximately 0.6 mm. The dimension of the light-emitting device 400 is approximately 2.0 mm×2.0 mm×0.6 mm. Comparing the light-emitting device 400 and the light-emitting device 100 shown in FIG. 1, the light-emitting device 400 without the sidewalls 200 (See FIG. 1) can be made relatively smaller. In addition, the form factor and small size of the light-emitting device 400 is suitable for many applications, for example, flash light in mobile devices such as camera phones, compact cameras and any other camera devices, among other things.

Figure 5A:
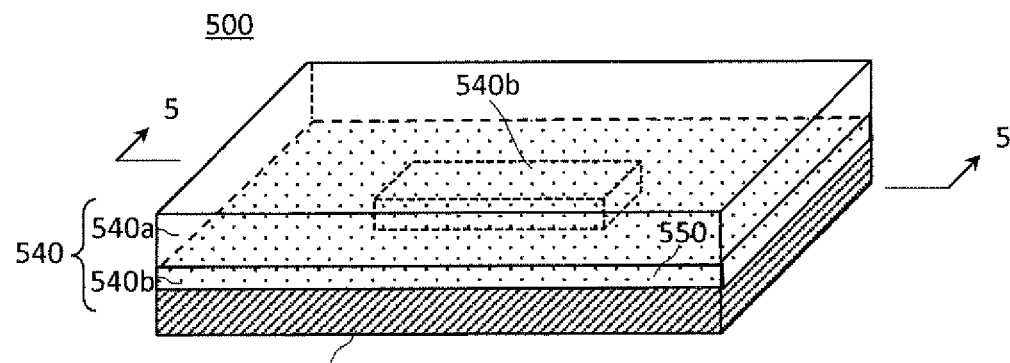
FIG. 5A illustrates a perspective view of a light-emitting device having a flip chip die manufactured using a group casting method.
Figure 5B:
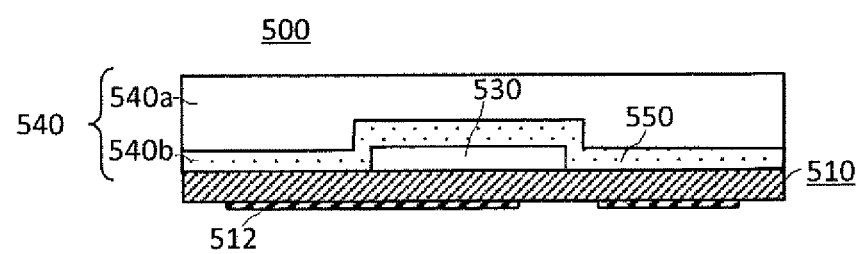
FIG. 5B illustrates a cross-sectional view of the light-emitting device shown in FIG. 5A taken along line 5-5.

FIG. 5A illustrates a perspective view of a light-emitting device 500 having a flip chip die manufactured using a group casting method. FIG. 5B illustrates a cross-sectional view of the light-emitting device 500, shown in FIG. 5A taken along line 5-5. The light-emitting device 500 is substantially similar to the light-emitting device 400, but differs at least in the fact that the light-emitting device 500 does not have any wire bonds 432 as in FIG. 4A. The light-emitting device 500 comprises a substrate 510, connector pads 512, a light source die 530, an encapsulation layer 540 encapsulating the light source die 530, and wavelength-converting material 550. Without the wire bond 432 (in FIG. 4A), the light source die 530 is connected to the substrate 510 through solder balls (not shown), which may be used in flip chip die manufacturing. The encapsulation layer 540 of the light-emitting device 500 further comprises a high density layer 540b and a low density layer 540a, as discussed above in FIGS. 4A-4C.

Figure 6:
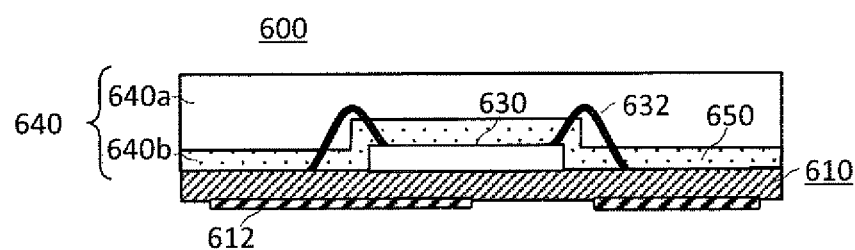
FIG. 6 illustrates a cross-sectional view of a light-emitting device having connector pads located away from the side.

FIG. 6 illustrates a light-emitting device 600, which comprises a substrate 610, connector pads 612, a light source die 630, a wire bond 632 connecting the die 630 to the substrate 610, an encapsulation layer 640 encapsulating the light source die 630 and the wire bond 632, and a wavelength-converting material 650. The encapsulation layer 640 further comprises a high density layer 640b and a low density layer 640a. The light-emitting device 600 is substantially similar to the light-emitting device 400 shown in FIG. 4B, but differs at least in the location of the connector pads 612. The connector pads 612 shown in FIG. 6 are not located at the side of the light-emitting device 600, but are located at a distance from each side of the light-emitting device 600. During some sawing processes, any metal portions, such as the connector pads 612 may be ripped off of the device during the sawing process if the metal portion is within the saw line 780 (See FIG. 7H). Thus, the separation of the metal connector pads from the sides of the device ensures the formation of the connector pads 612 without being ripped off during any sawing processes of manufacturing.

Figure 7A:
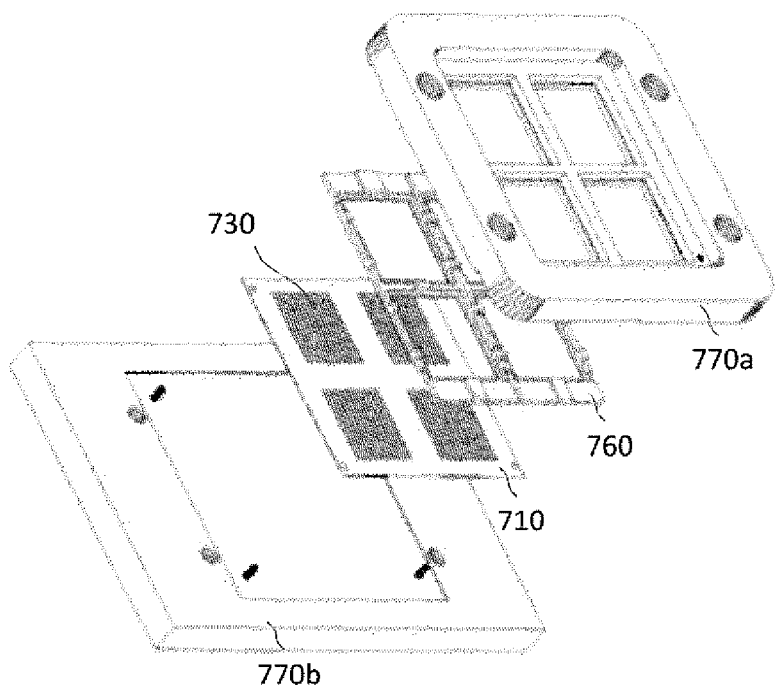
FIGS. 7A-7H illustrate how light-emitting devices are fabricated using a group casting method.
Figure 7B:
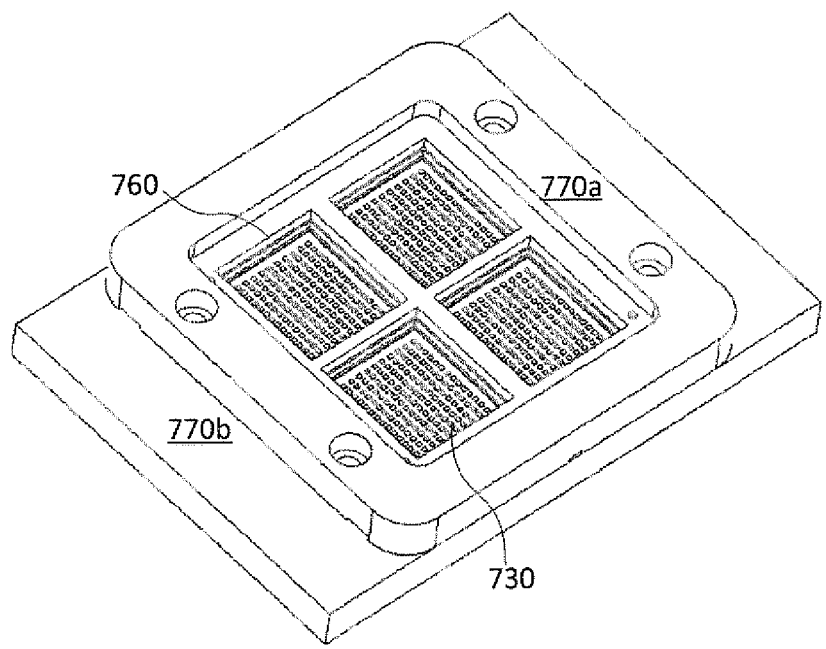
Figure 7C:
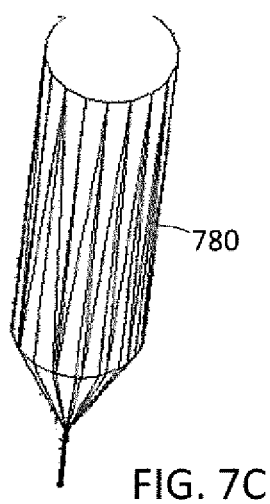
Figure 7D:
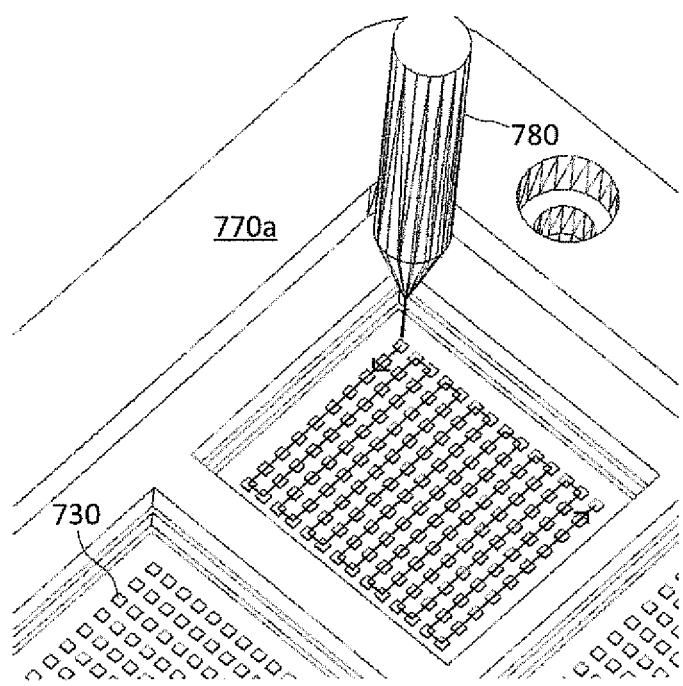
Figure 7E:
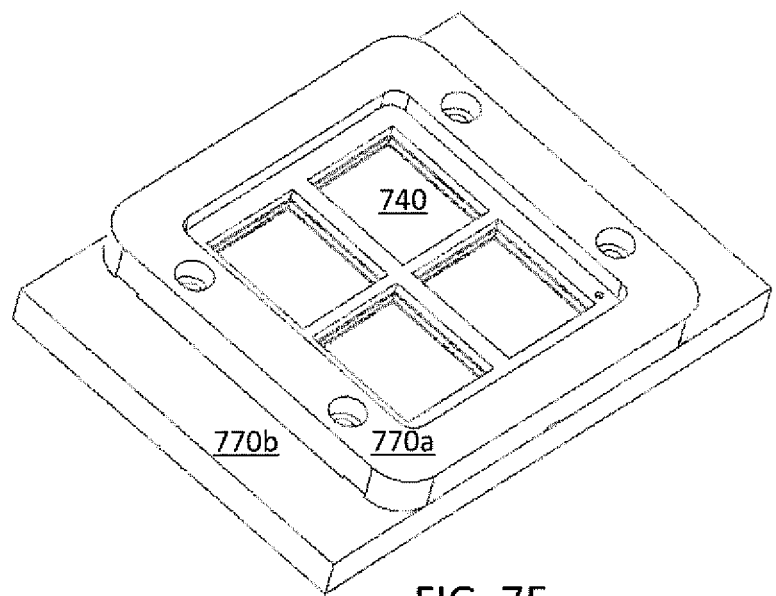
Figure 7F:
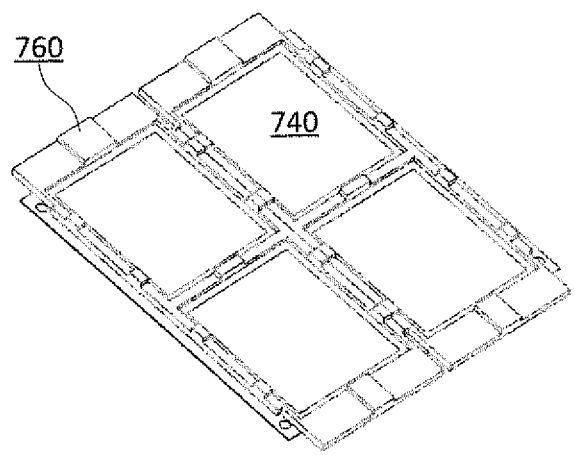
Figure 7G:
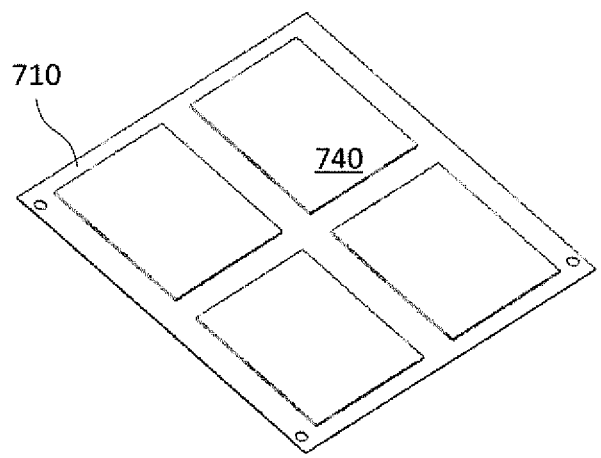
Figure 7H:
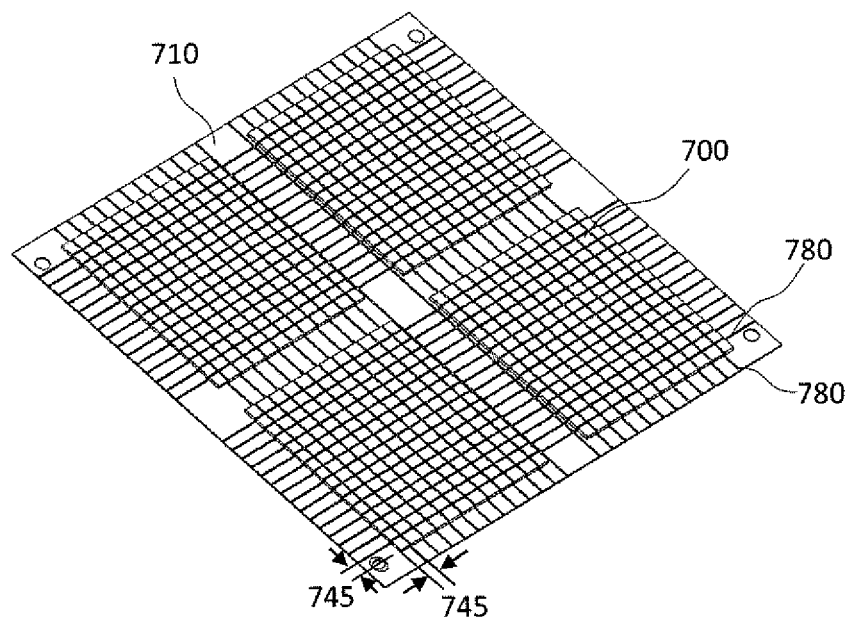
Figure 8:
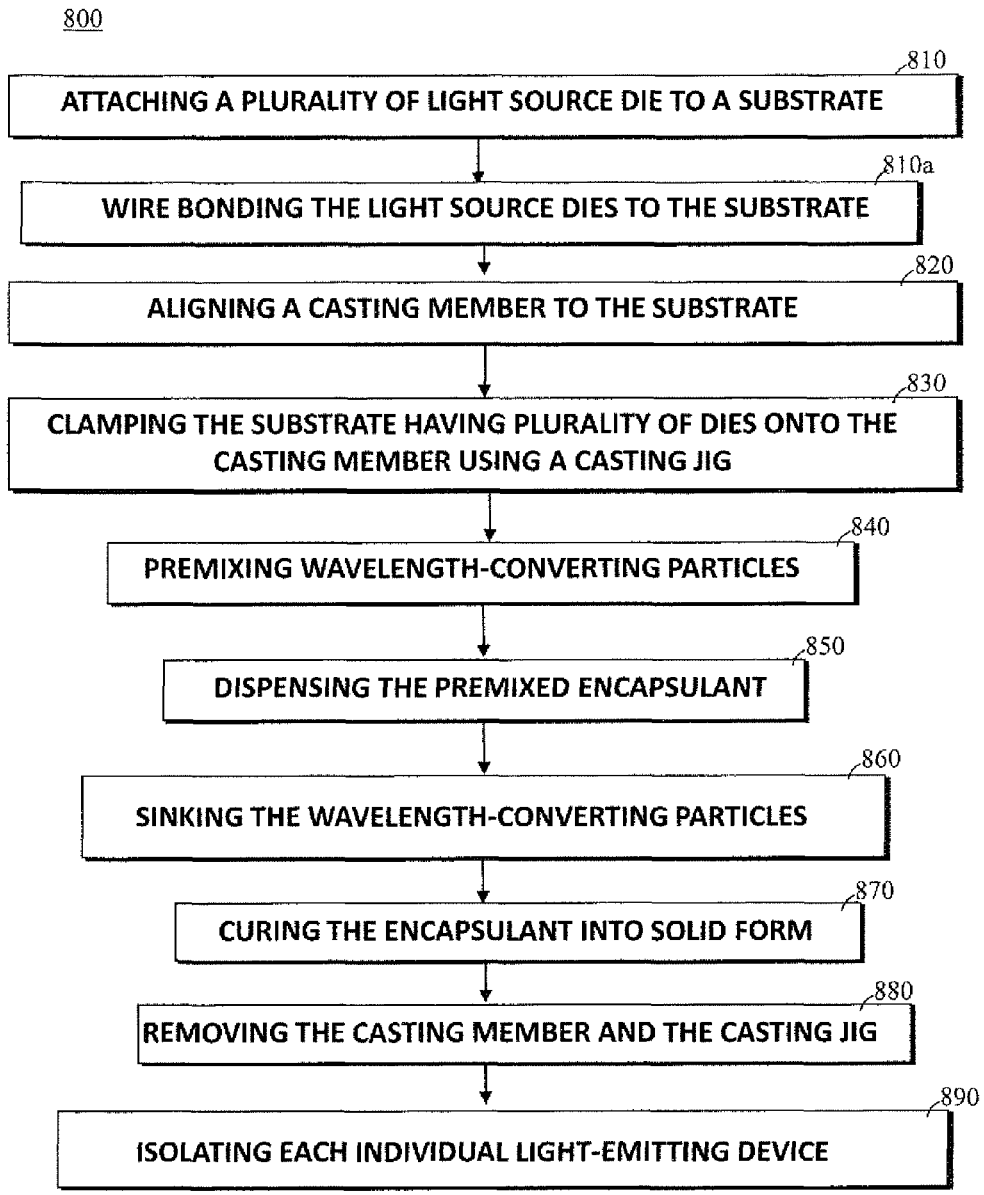
FIG. 8 illustrates a flow chart representing a method for manufacturing a light-emitting device.

FIGS. 7A-7H illustrate how the light-emitting devices 700 are fabricated using a group casting method as discussed with reference to the flow chart of FIG. 8. Referring to FIGS. 7A-7H and FIG. 8, the method for fabricating light-emitting device 700 (shown in FIG. 7h) starts with step 810 in which a plurality of light source dies 730 are attached on a substrate 710, as shown in FIG. 7A. In the embodiment shown in FIG. 7A, the substrate 710 is a PCB having four groups of light source dies 730 (See also FIG. 7B), attached to a top surface of the substrate 710. Each group may comprise 150 light source dies 730. Alternative numbers and arrangements may be possible, depending on design and manufacturing requirements. For non-flip chip type of light source dies 730, optional step 810a may occur, in which wire bonding the light source dies 730 to the substrate 710 may be required. Next, the method proceeds to step 820 in which a casting member 760, having at least one cavity is aligned to the substrate 710, such that the light source dies 730 are enclosed within the cavity. In the embodiment shown in FIG. 7A, the casting member 760 is a casting rubber member defining four cavities configured to enclose each group of the light source dies 730. Other arrangements may be possible, including a casting member of other materials. In step 830, the casting member 760 and the substrate 710 are clamped together, using a casting jig 770a-770b, to fix the position of the casting member 760 relative to the substrate 710 as shown in FIG. 7B.

In step 840, which may be done concurrently to steps 810-830, an encapsulant having wavelength-converting material therein may be premixed. Step 840 can also be done before or after steps 810-830. The encapsulant is in A-stage that is a liquid-form. The premixed encapsulant may be placed in a dispensing apparatus 780, as shown in FIG. 7C. Generally, the encapsulant needs to be used within a predetermined time period after preparation. Therefore, although the premixing of encapsulant may be done concurrently or prior to steps 810 to 830, usually step 840 is carried out after the die attach and wire bonding are done. The encapsulant may be silicon, epoxy or any other similar material.

The method then proceeds to step 850, in which the premixed encapsulant is dispensed into or over the cavities. In the embodiment shown in FIG. 7D, the dispensing is done in a zip-zag manner. However, other dispensing patterns may be used. Next, in step 860, the wavelength-converting material is then allowed to sink or settle, such that a low density layer and a high density layer are formed. In the low density layer, the wavelength-converting material (shown in FIG. 4C) suspends within the encapsulant 740 in particle form. On the contrary, the high density layer comprises of a layer of precipitated wavelength-converting material. In the embodiment shown in FIGS. 7A-7H, the sinking or settling process is done having the top surface of the substrate 710 facing upwards. Therefore, the high density layer is formed in direct contact with the top surface of the substrate. If the sinking process is done in an opposite manner in which the top surface of the substrate 710 faces downwards, the low density layer will form in direct contact with the top surface of the substrate 710. The sinking process may be done under a condition such as the casting jig 770a-770b is rotated to ensure that the thickness of the encapsulation layer is substantially consistent. Next, the method proceeds to step 870 in which the encapsulant is cured into a solid form. Step 860 and step 870 may be done substantially simultaneously. Step 860 may also comprise other details, such as degasing the encapsulation layer. In yet another embodiment, the step 870 of curing the encapsulation layer may be done in a temperature under 150 degrees Celsius for 4 hours, which is done after step 860.

Next, the process proceeds to step 880, in which the casting member 760 and the casing jig 770a-770b are removed, as shown in FIGS. 7F-7G. Finally, the method proceeds to step 890, in which each individual light-emitting is isolated, for example by means of sawing. In the embodiment shown in FIG. 7H, the common substrate 710, having a plurality of light source dies 730 being encapsulated within a layer of encapsulation layer may be sawed. This step may also be accomplished by means of chemical or laser etching, or other known separation means. Generally, the meniscus or curvature portions are formed at the outer perimeter of the encapsulation layer, because this is where the liquid encapsulant touches the casting member 760. An area at the outer perimeter of the encapsulation layer may be selected to define a dummy area 745. Dummy area 745 is an area where the substrate 710 is without attached light source dies 730 or circuits but being enclosed by the encapsulation layer. The size of the dummy area 745 is selected such that meniscus or curvature portions are formed only within the dummy area 745. The dummy area 745 can be easily removed by sawing or other separation means. Compared to the light-emitting device 200 shown in FIG. 2 manufactured using a transfer mold method, the elimination of the dummy area 745 is cost effective. Casting the light-emitting devices 700 in groups reduce the dummy area 745 needed per unit of devices.

FIG. 7H shows saw or separation lines 780 dividing the substrate 710 into columns and rows to yield a rectangular shape light-emitting device 700. As the side of the light-emitting device is produced through sawing, the size and shape of the encapsulation layer and the substrate 710 are substantially similar. One cost effective shape for the light-emitting device 700 is rectangular shape as more devices can be fit per unit area. However, for any other customization or any needs to adapt the form factor into other shapes, the method illustrated in FIG. 8 is applicable. For example, for a disc shape device, the isolation of individual devices may be done through laser cutting, V-cutting, stamping or any other similar process instead of the sawing process illustrated in the example given above.

Figure 9:
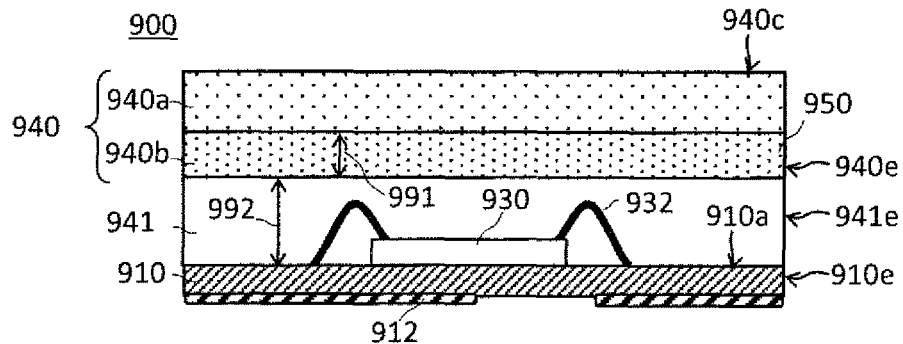
FIG. 9 illustrates a light-emitting device with a optical coupling layer.

The light source die 530 (See FIG. 5) can be separated from the encapsulation layer 540 (See FIG. 5) using an additional layer as shown in various embodiments shown hereinafter. FIG. 9 illustrates an embodiment of a cross-sectional view of a light-emitting device 900 comprising a substrate 910 having a top surface 910a, connector pads 912, a light source die 930, an optical coupling layer 941 encapsulating the light source die 930, an encapsulation layer 940 formed on the optical coupling layer 941, and a wavelength-converting material 950. The substrate 910 may comprise a plurality of conductors (not shown) electrically coupled to the light source die 930. The light source die 930 is mounted on the top surface 910a of the substrate 910. Wire bonds 932 may be formed to establish electrical connection between the light source die 930 and the substrate 910. The top surface 940c of the light-emitting device 900 may be flat and may define a rectangular shape.

In the embodiment shown in FIG. 9, the optical coupling layer 941 and the encapsulation layer 940 may be formed using one single type of encapsulant. However, the optical coupling layer 941 may be framed differently than the encapsulation layer 940 by substantially avoiding addition of the wavelength converting material 950 to the optical coupling layer 941. The encapsulant may be silicone, epoxy or other similar material for encapsulating light source die 930. The encapsulant may be substantially transparent to light such that light emitted from the light source die 930 may be coupled through the optical coupling layer and the encapsulation layer without much loss.

Initially in a manufacturing process, the optical coupling layer 941 may be in liquid or semi-liquid-form to encapsulate the top surface 910a of the substrate 910 and the light source die 930, but may be cured into solid from towards an end of the process. The encapsulation layer 940 on the other hand, may be made from similar encapsulant used to form the optical coupling layer 941 but may be pre-mixed with the wavelength converting material 950 for the manufacturing process. The wavelength converting material 950 may be allowed to precipitate. This may yield a high density layer 940b and a low density layer 940a, as shown in FIG. 9. In yet another embodiment, the optical coupling layer 941 and the encapsulation layer 940 may be formed using two different types of materials, which may be two different types of epoxies.

The high density layer 940b may be formed by a layer of the wavelength-converting material 950 precipitated on one side of the encapsulation layer 940, usually in particle form, similar to the embodiment shown in FIG. 4C. The low density layer 940a may comprise a low density of the wavelength converting material 950 in particle form suspended within the encapsulant, similar to the embodiment shown in FIG. 4C. The wavelength converting material 950 may be sparsely distributed in the low density layer 940a, but may be distinguishably visible using a microscope. Accordingly, relative to the low particle density of the low density layer 940a, the high density layer 940b may have a substantially higher density of particles of the wavelength converting material 950. In contrast to the low density of particles in the low density layer 940a, the particles of the wavelength converting material 950 may be densely precipitated in the high density layer 940b. The high density layer 940b may be in direct contact with the optical coupling layer 941 as shown in FIG. 9.

However, in another embodiment, the high density layer 940b may be alternatively arranged. In another embodiment, arrangement order of the low density layer 940a and the high density layer 940b may be reversed relative to arrangement order of the low density layer 940a and the high density layer 940b as shown in FIG. 9. Accordingly, in another embodiment the low density layer 940a may be in direct contact with the optical coupling layer 941 instead.

Both the low density layer 940a and the high density layer 940b may be made substantially flat and planarly parallel to the top surface 910a of the substrate 910 as shown in FIG. 9. In embodiments that may have the optical coupling layer 941 formed below the encapsulation layer 940, the high density layer 940b may substantially avoid direct contact with the light source die 930.

Thickness 991 of the high density layer 940b may be made consistent across the entire layer. This may provide for light uniformity. Light uniformity may result because light emitted from the top surface 940c from any area may be similar in color as light propagating through substantially same thickness 991 of the wavelength converting material 950.

The wire bond 932 may be fully encapsulated as shown in FIG. 9 but alternatively a portion of the wire bond 932 may protrude into the encapsulation layer 940 such that a portion of the wire bond 932 is encapsulated by the encapsulation layer 940. In one embodiment, the wire bond 932 may protrude into the encapsulation 940 especially when the thickness 992 of the optical coupling layer 941 is less than 100 micro-meters.

Usually the light emitted from the light source die 930 may have a narrow bandwidth defining a color. The light may be coupled through the optical coupling layer 941 and may be then transformed into another color or a broad spectrum light when propagating through the wavelength converting material 950 in the encapsulation layer 940. For example, the light source die 930 may be configured to emit blue light but the light seen externally after the light going through the top surface 940c is a white color light having a broad spectrum wavelength.

Members of the light-emitting device 900 may be arranged for coupling much or most of the narrow bandwidth light emitted by the light source die 930 to the wavelength converting material 950 in the encapsulation layer 940, which may provide for efficient conversion into broad spectrum light. The high density layer 940b may directly contact edges of all sides 940e of the encapsulation layer 940e, which may define a portion of side surfaces of the entire light-emitting device. The encapsulation layer 940 and the optical coupling layer 941 may further comprise side surfaces 940e and 941e, which may have substantially similar respective perimeters with side walls that may be stacked adjacent to each other as shown in FIG. 9. Specifically, this arrangement may provide for light emitted from the light source die 930 being transmitted through the wavelength converting material 950 before exiting through the top surface 940c. For reliability considerations, the substrate 910 and the optical coupling layer 941 may further comprise side surfaces 910e and 941e, which may have substantially similar respective perimeters with side walls, and which may be stacked adjacent to each other as shown in FIG. 9.

Figure 10:
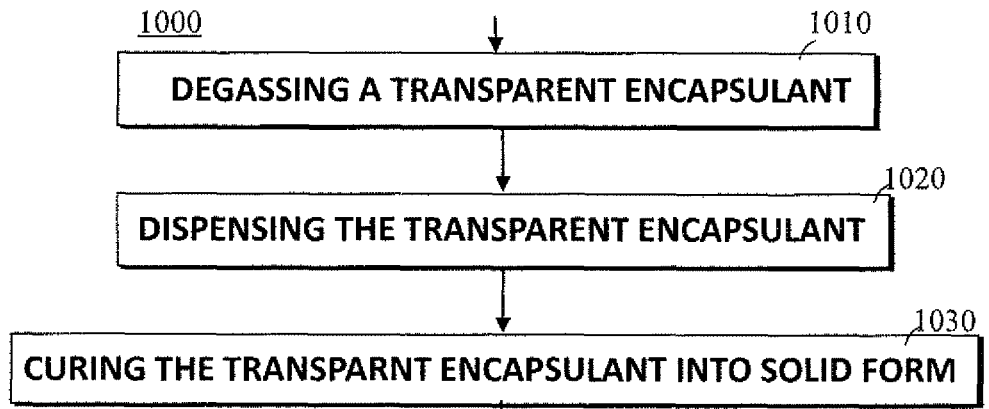
FIG. 10 illustrates additional steps involving fabrication of the light-emitting device shown in FIG. 9.

The light-emitting device 900 may be made using the method 800 shown in FIG. 8 with additional steps 1000 shown in FIG. 10. The additional steps 1000 shown in FIG. 10 may be performed for example, between step 830 and 840 (See FIG. 8). However, the additional steps 1000 illustrated in FIG. 10 may be performed simultaneously together with step 840 shown in FIG. 8.

As shown in FIG. 10, a transparent encapsulant may be degassed in step 1010. The transparent encapsulant may then be dispensed into the cavity, so as to encapsulate the light source die and a portion of the top surface of the substrate in step 1020. In step 1030, the transparent encapsulant may then be cured into solid form, forming the optical coupling layer 941 shown in FIG. 9. Optionally, the top surface of the transparent encapsulant may be polished into a flat surface prior to dispensing of the encapsulation layer discussed in FIG. 8. The encapsulation layer may then be formed on the optical coupling layer as described in steps 840-870 shown in FIG. 8.

Figure 11:
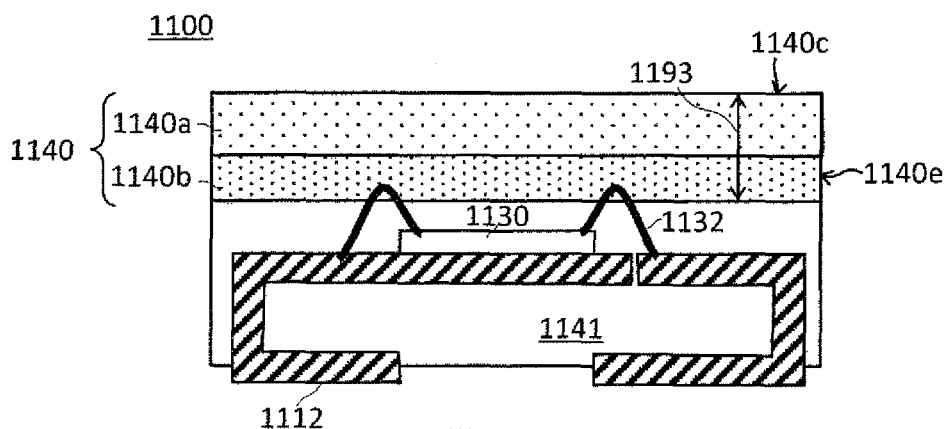
FIG. 11 illustrates a light-emitting source package having a lead frame.

FIG. 11 illustrates an embodiment showing a light source package 1100. The light source package 1100 may comprise a plurality of conductors 1112, a light source die 1130 (which may be mounted on one of the conductors 1112), an optical coupling layer 1141 (which may encapsulate the light source die 1130 and a substantial portion of the conductors 1112), and a wavelength converting layer 1140 (which may be formed on the optical coupling layer 1141). Wire bonds 1132 may be formed to provide electrical connection between the light source die 1130 and the conductors 1112. The conductors 1112 may define leads, which may be electrically coupled to external circuits. As shown in the embodiment in FIG. 11, a portion of the wire bond 1132 may be encapsulated within the wavelength converting layer 1140.

In the embodiment shown in FIG. 11, the wavelength converting layer 1140 may comprise a low density layer 1140a and a high density layer 1140b. The low density layer 1140a may comprise wavelength converting particles suspended within the layer 1140a. The high density layer 1140b may comprise precipitated wavelength converting particles as shown in FIG. 4C. The low density layer 1140a of the wavelength converting layer 1140 may be identified and distinguishable from the optical coupling layer 1141 as the low density layer 1140b may comprise suspended wavelength converting particles, which may be visible at least by using a microscope. The precipitate of wavelength converting particles in the high density layer 1140b may be visible without using a microscope. The optical coupling layer 1141 may be configured to separate the wavelength converting particles in the wavelength converting layer 1140 from the light source die 1130, such that a uniform layer of precipitated wavelength converting particles can be formed in the high density layer 1140b.

The wavelength converting layer 1140 may comprise a top flat surface 1140c and at least one side surface 1140e. The top flat surface 1140c may define top surface of the light source package 1100. The at least one side surface 1140e may define a portion of side surfaces of the light source package 1100. The high density layer 1140b may be in direct contact with the optical coupling layer 1141 but in another embodiment, such arrangement can be reversed. The wavelength converting layer 1140 may have a uniform or substantially uniform thickness 1193. The light source package 1100 may be used for packaging LEDs used in camera devices.

Figure 12:
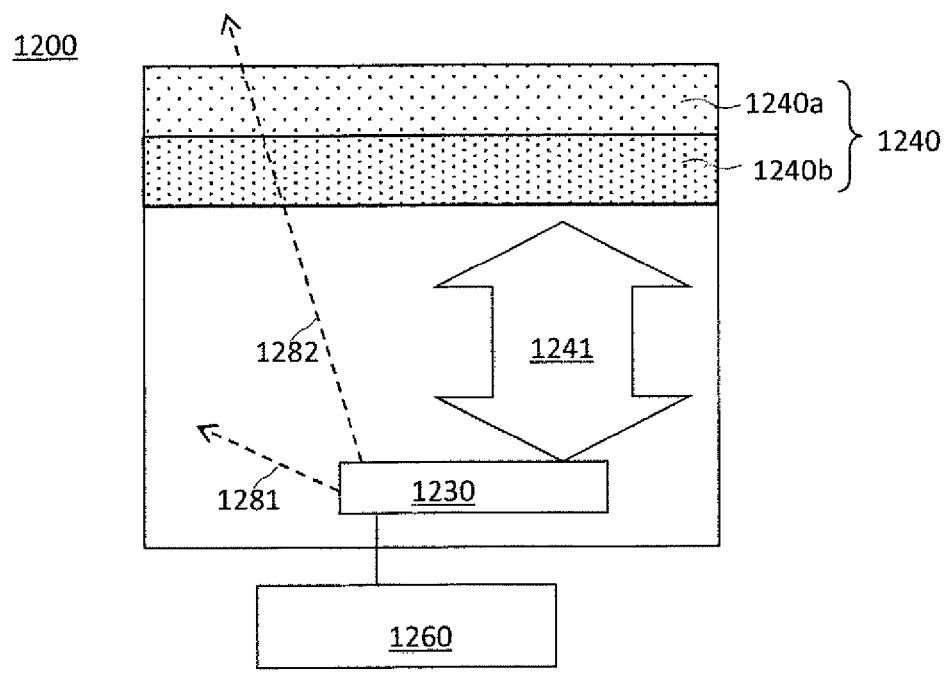
FIG. 12 illustrates a flash system.

FIG. 12 illustrates an embodiment showing a block diagram of a flash system 1200. The flash system 1200 may be used in a mobile device. In particular, the flash system 1200 may be an integrated flash light source used in camera devices.

The flash system 1200 shown in the embodiment may comprise a light source 1230, a wavelength converting layer 1240, a transparent separation layer 1241, and a controller circuit 1260. The controller circuit 1260 may adapted for arrangement within the mobile device. The controller circuit may be electrically coupled with the light source 1230 for activating the light source 1230 to flash a light 1281 and 1282.

The transparent separation layer 1241 may be configured to distance the light source 1230 away from the wavelength converting layer 1240. The transparent separation layer 1241 may usually be a transparent encapsulant adaptable to transmit light. The wavelength converting layer 1240 may further comprise a low density layer 1240a having wavelength converting particles suspended within the layer, and a high density layer 1240b having precipitated wavelength converting particles as shown in FIG. 4C. The light 1281 emitted from the light source 1230 may usually comprise a narrow spectrum. Light 1282 coupled through the optical coupling layer 1141 into the wavelength converting layer 1140 may be converted into a broad spectrum light prior to exiting the flash system 1200.

Figure 13:
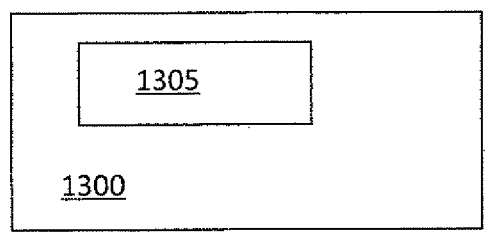
FIG. 13 illustrates a block diagram of a mobile device.

FIG. 13 illustrates an embodiment showing a block diagram of a camera device 1300. The camera device 1300 may be a mobile phone, a digital camera, a camcorder, or any other similar devices having a camera function. The camera device comprises a flash 1305. The flash 1305 may be an integrated flash system 1200 shown in FIG. 12, light-emitting devices 900, or any other devices shown in various embodiments, including embodiments explained subsequently hereinafter.

Figure 14:
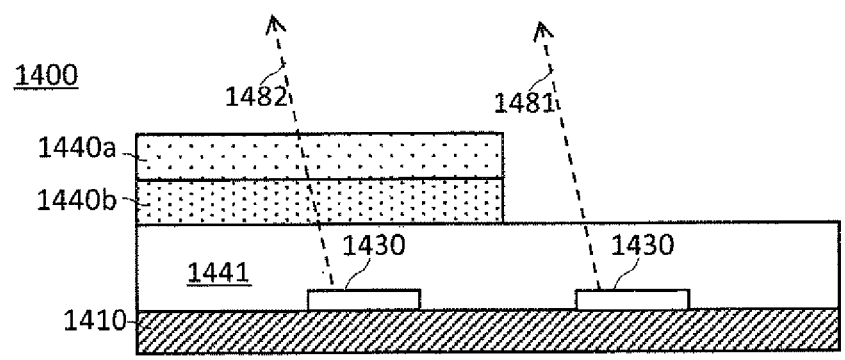
FIG. 14 illustrates a lighting apparatus.

FIG. 14 illustrates an embodiment of a lighting apparatus 1400, which may comprise a substrate 1410, at least one light source die 1430 configured to emit light, an optical coupling layer 1441 encapsulating the at least one light source die 1430, a low density wavelength converting layer 1440a having wavelength converting particles suspended within the layer, and a high density wavelength converting layer 1440b having precipitated wavelength converting particles. In addition to flash, the lighting apparatus 1400 may comprise light fixtures used in solid-state lighting. The lighting apparatus 1400 may be configured to emit light having a different color than light emitted by light source die 1430. For example, as shown in the embodiment in FIG. 14, light 1481 emitted from the light source die 1430 may have a narrow band with a peak wavelength, and may exit the lighting apparatus 1400 via the optical coupling layer 1441. Another portion of light 1482 may exit the lighting apparatus 1400 via the wavelength converting layers 1440a and 1440b and may be converted thereby to a broad spectrum light having a different color. The broad-spectrum light 1482 may be white in color whereas the narrow band light 1481 may be blue or green in color.

Figure 15E:
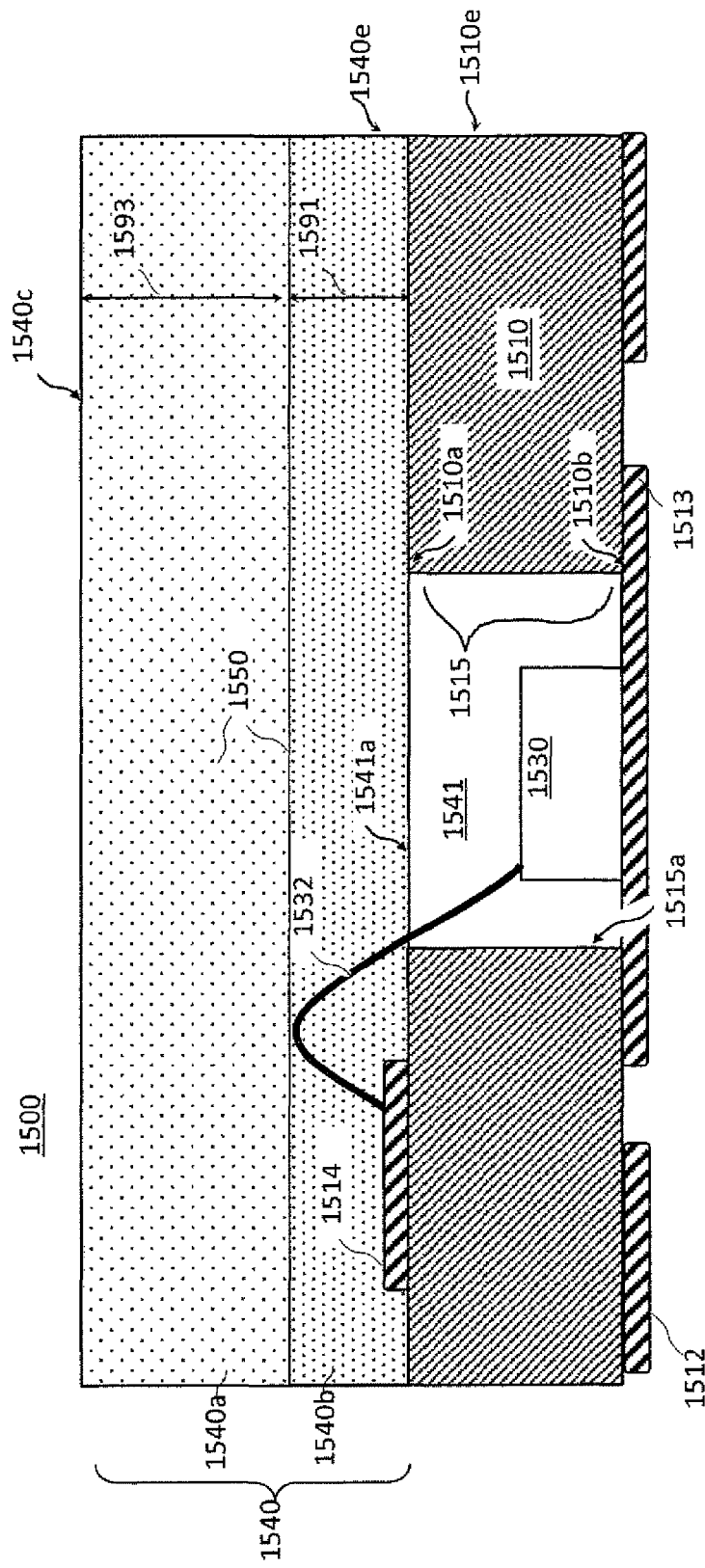

FIGS. 15A-15E illustrate an embodiment of a light-emitting device 1500. FIG. 15A-15D illustrate how the light-emitting device 1500 may be made by showing partial forming of light-emitting device 1500 at key manufacturing stages. Referring first to FIG. 15E, the light-emitting device 1500 may comprise a substrate 1510 having a first surface 1510b (or a bottom surface 1510b in FIG. 15E) and a second surface 1510a (or a top surface 1510a in FIG. 15E), connector pads 1512, a light source die 1530, an optical coupling layer 1541 encapsulating the light source die 1530, an encapsulation layer 1540 formed on the optical coupling layer 1541, and a wavelength converting material 1550. As discussed earlier, the wavelength converting material 1550 may be located within the encapsulation layer 1540. Thus, the encapsulation layer 1540 may be referred to as a wavelength converting layer 1540. The wavelength converting layer 1540 may have a low density layer 1540a and a high density layer 1540b.

As shown in FIG. 15A, the light-emitting device 1500 may be assembled or formed from the substrate 1510 such as a PCB, a flexible circuit, a ceramic substrate or any other similar structures having two opposite major surfaces, i.e. the first surface 1510b and the second surface 1510a. The substrate 1510 may be substantially flexible. The substrate 1510 may be made from electrically insulating material such as BT-Epoxy, composite epoxy material CE-1,5, Cyanate Ester, FR-2, FR-4, Polyimide or Polytetrafluoroethylene used to make PCB. In one embodiment, the substrate 1510 may be substantially flexible and may comprise polyimide used to make flexible circuit. In yet another embodiment, the substrate 1510 may comprise aluminum oxide or aluminum nitride used to make ceramic substrate. The substrate 1510 may comprise ceramic material. Ceramic may comprise a majority of material of the substrate 1510. The substrate 1510 may comprise composite material. Composite may comprise a majority of material of the substrate 1510. The substrate 1510 may comprise a polymer. Polymer may comprise a majority of material of the substrate 1510.

The light-emitting device 1500 may further comprise a plurality of conductors 1512, 1513, 1514 disposed on the first and second surfaces 1510b, 1510a of the substrate 1510. The plurality of conductors 1512, 1513, 1514 may include, but not limited to, connector pads 1512, a die attach pad 1513, and connecting traces 1514 as shown in FIG. 15A. The connector pads 1512, formed on the first surface 1510b, may be configured to connect the light-emitting device 1500 to an external circuit (not shown).

The substrate 1510 may comprise an aperture 1515 extending from the second surface 1510a to the first surface 1510b as shown in FIG. 15B. A drill process, for example a laser drill process may be employed to form the aperture 1515, which may provide a drilled aperture 1515. During the laser drill process, the drilling process may stop right before the die attach pad 1513 so that the die attach pad 1513 may be accessible from the top surface 1510b. Other processes such as mechanical drilling or etching may be employed but the die attach pad 1513 may be made thicker because part of the die attach pad 1513 may be etched or drilled away in the process.

For purposes of illustration, in the figures a bracket with the reference numeral 1515 is depicted as disposed within the drilled or etched aperture 1515. The drilled or etched aperture 1515 will be referred hereinafter as aperture 1515. Further, it should be noted that the second surface 1510a and the first surface 1510b are shown as proximate to opposing extremities of the bracket associated with aperture 1515, so as to particularly illustrate the aperture 1515 extending from the second surface 1510a to the first surface 1510b. As shown in FIG. 15B, the die attach pad 1513 may be configured to cover the aperture 1515 at the bottom surface 1510b or the first surface 1510b. A top view (not shown) of the aperture 1515 may be circular shape.

The die attach pad 1513 formed on the first surface 1510b may be configured to receive the light source die 1530 within the aperture 1515. As shown in FIG. 15C, the light source die 1530 may be attached to the die attach pad 1513 such that the light source die 1530 is located inside the aperture 1515. Being located on the first surface 1510b (or a bottom surface 1510b as in FIG. 15C), the die attach pad 1513 may be configured to dissipate heat generated by the light source die 1530 to an external surface (not shown). With the arrangement shown in the embodiment in FIG. 15C, the light source die 1530 that generates heat may be placed proximate to the external surface (not shown) and may be able to dissipate heat onto the external surface (not shown) via the die attach pad 1513, which may be highly conductive in dissipating heat.

The connecting traces 1514 formed on the second surface 1510a may be electrically coupled to the light source die 1530 via a wire bond 1532. As shown in FIG. 15C, the wire bond 1532 may be encapsulated at least partially in the wavelength converting layer 1540. The connecting traces 1514 located on the second surface 1510a may be electrically coupled to the die attach pad 1513 or the connector pads 1512 on the first surface 1510b through a via (not shown).

As shown in FIG. 15D, the optical coupling layer 1541 may be configured to encapsulate the light source die 1530 within the aperture 1515. The optical coupling layer 1541 may be configured to fill up the aperture 1515 substantially or completely as illustrated in FIG. 15D. The optical coupling layer 1541 in liquid form may be disposed into the aperture 1515 to encapsulate the light source die 1530 and at least a portion of the wire bond 1532 before being cured into solid form. The optical coupling layer 1541 may fill up the aperture 1515 fully or partially. In FIG. 15D, the top surface 1541a of the optical coupling layer 1541 may be polished such that the top surface 1541a may be integrally formed as a flat surface together with the top surface 1510a of the substrate 1510.

As shown in FIG. 15E, the wavelength converting layer 1540 may be formed above the optical coupling layer 1541. Optionally, the wavelength converting layer 1540 may cover entirely the second surface 1510a of the substrate 1510 as shown in FIG. 15E such that the sidewalls 1540e of the wavelength converting layer 1540 may also define sidewall of the entire light-emitting device 1500. Similar to what was already explained previously herein with regard to another embodiment, the sidewall of the light-emitting device 1500 may comprise sidewall 1510e of the substrate 1510 and sidewall 1540e of the wavelength converting layer 1540.

The high density layer 1540b of the wavelength converting layer 1540 may be formed adjacent to and may be in direct contact with the optical coupling layer 1541. In FIG. 15E, the high density layer 1540b may be formed above and/or adjacent to the aperture 1515 at the second surface 1510a. However, in another embodiment, the optical coupling layer 1541 may not cover the aperture 1515 completely and part of the high density layer 1540h may be disposed within the aperture 1515.

As discussed earlier, the optical coupling layer 1541 and the wavelength converting layer 1540 may be formed using one single type of encapsulant. However, the optical coupling layer 1541 may be at least differentiated from the wavelength converting layer 1540 with a distinguishing feature that the wavelength converting material 1550 in at least some embodiments may not be added to the optical coupling layer 1541 and/or may be formed separately from the optical coupling layer. The encapsulant may be substantially transparent to light such that the light emitted from the light source die 1530 may be coupled through the optical coupling layer 1541 and the encapsulation layer 1540 without much light loss.

Similar to previous embodiments, the high density layer 1540b may be formed by a layer of the wavelength converting material 1550 precipitated on one side of the wavelength converting layer 1540, usually in particle form, similar to the embodiment shown in FIG. 4C. The low density layer 1540a may comprise a low density wavelength converting material 1550 in particle form suspended within the encapsulant, similar to the embodiment shown in FIG. 4C. The wavelength converting material 1550 may be sparsely distributed in the low density layer 1540a, but may be distinguishably visible using a microscope.

The structure shown in FIG. 15E may be related closely to the manufacturing steps involved. For example, the optical coupling layer 1541 may be formed and cured into solid form first before forming the wavelength converting layer 1540. As the wavelength converting material 1550 may be allowed to precipitate on the substrate 1510 within the wavelength converting layer 1540, the high density layer 1540b may be formed above, and in direct contact with the second surface 1510a of the substrate 1510. Thus, the low density layer 1540a may be formed above the high density layer 1540b.

The thickness dimension 1591 of the high density layer 1540b may affect optical performance of the light-emitting device 1500. For example, a thinner thickness dimension 1591 may improve light extraction. In addition, making a thicker high density layer 1540b may require more quantity of the wavelength converting material 1550 to be used. As shown in FIG. 15, when the wavelength converting layer 1540 is configured to cover the entire substrate 1510, the thickness 1591 of the high density layer 1540b may be generally less than the thickness 1593 of the low density layer 1540a. In another embodiment where there is a minimum thickness requirement, the thickness 1593 of the low density layer 1540a may be made more than two times the thickness 1591 of the high density layer 1540b. The ratio between the thickness 1591 of the high density layer 1540b and the thickness 1593 of the low density layer 1540a may be controlled by adjusting the concentration of the wavelength converting material 1550 in the wavelength converting layer 1540.

To obtain a more uniform light extraction, the high density layer 1540b may be made substantially uniformly thick across the aperture 1515 or even across the entire second surface 1510a of the substrate 1510. However, the optical coupling layer 1541 may be susceptible to capillary effect and the top surface 1541a of the optical coupling layer 1541 may not be flat. Precipitating the wavelength converting material 1550 on the non-uniform top surface 1541a may not yield a high density layer 1540b with uniform thickness 1591. The top surface 1541a of the optical coupling layer 1541 may be polished and may be made substantially flat prior to forming the wavelength converting layer 1540.

By having the optical coupling layer 1541 completely fill up the aperture 1515, the top surface 1541a of the optical coupling layer 1541 can be polished or be made flat easily, which will in turn may yield a substantially uniform high density layer 1540b and may yield a more uniform light. The top surface 1540c of the wavelength converting layer 1540 may also define the top surface 1540c of the light-emitting device 1500. As shown in FIG. 15E, the top surface 1540c may be made substantially flat to ensure uniformity.

Referring to FIG. 15E, light may be transmitted within the aperture 1515 and the wavelength converting layer 1542 above the substrate 1510. Therefore, as light transmitted within aperture 1515 encounters the substrate 1510, the substrate 1510 may be made to appear highly reflective to light The second surface 1510a may be configured to reflect light. In a similar way, the sidewall 1515a of the aperture 1515 may be optionally made highly reflective covered by a reflective material such as a metal.

FIGS. 16A-16E illustrate an embodiment of a cross-sectional view of a light-emitting device 1600. FIGS. 16A-16D illustrate how the light-emitting device 1600 may be made by showing light-emitting device 1600 partially assembled at a few key manufacturing stages. The light-emitting device 1600 may comprise a substrate 1610 having a first surface 1610b (or a bottom surface 1610b in FIGS. 16A-16C) and a second surface 1610a (or a top surface 1610a in FIGS. 16A-16C), a plurality of conductors 1611-1614, a light source die 1630, an optical coupling layer 1641, a wavelength converting layer 1640 and an additional optical coupling layer 1642. As discussed earlier, the wavelength converting layer 1640 may have a low density layer 1640a and a high density layer 1640b.

The substrate 1610 may be a PCB, a flexible circuit, a ceramic substrate or any other similar structures having two opposite major surfaces, i.e. the first surface 1610b and the second surface 1610a. The substrate 1610 may be made from electrically insulating material such as BT-Epoxy, composite epoxy material CE-1,5, Cyanate Ester, FR-2, FR-4, Polyimide or Polytetrafluoroethylene used to make PCB; polyimide used to make flexible circuit; and aluminum oxide or aluminum nitride used to make ceramic substrate.

As shown in FIG. 16A, the plurality of conductors 1611, 1612, 1613, 1614 disposed on the first and second surfaces 1610b, 1610a of the substrate 1610 may comprise an alignment metal portion 1611, a connector pad 1612, a die attach pad 1613, and a connecting trace 1614. The alignment metal portion 1611 may provide an alignment mark or an alignment guide for making the aperture 1615 during a manufacturing process to laser drill the aperture 1615. A drill process, for example a laser drill process may be employed to form the aperture 1615, which may provide a drilled aperture 1615. During the laser drill process, the drilling process may stop right before the die attach pad 1613 and the metal portion 1611 so that the die attach pad 1613 may be accessible from the top surface 1610b.

As the laser drill process may be configured to stop drilling when metal is detected, by using the alignment metal portion 1611 and the die attach pad 1613, the laser drill process may be controlled more precisely. Other processes such as mechanical drilling or etching may be employed but the die attach pad 1613 and the alignment metal portion 1611 may be made thicker because part of the die attach pad 1613 may be etched or drilled away in the process. The drilled or etched aperture 1615 will be referred hereinafter as aperture 1615.

The alignment metal portion 1611 may be configured to form a reflector 1611 when an aperture 1615 is formed as shown in FIG. 16B. The reflector 1611 may be a portion of the conductors 1611, 1612, 1613, 1614 disposed on the surrounding sidewall 1615a of the aperture 1615. The reflector 1611 may be made from metallic material and can be made highly electrically conductive. Furthermore, the reflector 1611 may have a similar function to a "via" interconnecting the conductive traces 1641 to the die attach pad 1613.

As shown in FIG. 16B, the aperture 1615 may extend from the second surface 1610a to the first surface 1610b. However, the die attach pad 1613 may cover the aperture 1615 at the first surface 1610*b*. The light source die 1630 may be attached onto the die attach pad 1613 such that the light source die 1630 may be disposed within the aperture 1615 as shown in FIG. 16B. The light source die 1630 may comprise solder bump (not shown) for electrical connection to the die attach pad 1613 and other portions of the plurality of conductors 1611, 1612, 1614, 1614.

As shown in FIG. 16C, the optical coupling layer 1641 may fill up a portion of the aperture 1615 such that the optical coupling layer 1641 may encapsulate the light source die 1630, the die attach pad 1613 within the aperture 1615. Optionally, the optical coupling layer 1641 may fill up the entire aperture 1615 but in order to have the wavelength converting layer 1640 formed within the aperture 1615, the optical coupling layer 1641 may fill up the aperture 1615 in such a way that the optical coupling layer 1641 may be configured to cover the light source die 1630 completely, leaving as much space as possible for the wavelength converting layer 1640.

As shown in FIG. 16D, the wavelength converting layer 1640 may be disposed within the aperture 1615. The wavelength converting layer 1640 may be disposed only within the aperture 1615 as shown in FIG. 16D. This may reduce the quantity of the wavelength converting material 1650 needed because only a small portion of the wavelength converting material 1650 may be required as compared to the embodiment shown in FIG. 15E. As the aperture 1615 may be small, a much smaller quantity of the wavelength converting layer 1640 may be needed. As shown in FIG. 16D, the wavelength converting layer 1640 may be confined within the aperture 1615. In another embodiment, the wavelength converting layer may overflow above the aperture 1615.

Consider that since the high density layer 1640*b* may comprise wavelength converting material 1650 needed to convert the color of the light, there may be a minimum thickness requirement for the high density layer 1640*b*. In contrast, the thickness 1693 of the low density layer 1640*a* may not have such restriction and may be made as thin as possible without affecting the optical property of the light-emitting device 1600. Thus, the thickness 1691 of the high density layer 1640*b* may be made thicker and the thickness 1693 of the low density layer 1640*a* may be made as thin as possible within the space available. This may be achieved by increasing the concentration of the wavelength converting material 1650 used in the wavelength converting layer 1640.

In one embodiment where the thickness 1695 of the wavelength converting layer 1640 may be approximately 0.2 mm, the thickness 1691 of the high density layer 1640*b* may be approximately equal to or slightly more than the thickness 1693 of the low density layer 1640*a*. The ratio of the thickness 1691 of the high density layer 1640*b* to the thickness 1693 of the low density layer 1640*a* may increase, as the wavelength converting layer 1640 may get thinner. For example, in one embodiment where the thickness 1695 of the wavelength converting layer 1640 may be less approximately than 0.2 mm, the thickness 1691 of the high density layer 1640*b* may be more than the thickness 1693 of the low density layer 1640*a*.

The thickness 1691 uniformity of the high density layer 1640*b* may be affected by capillary effect as discussed earlier. However, the impact of the capillary effect may be reduced by having a wider width dimension 1699 of the aperture 1615 relative to the width 1697 of the light source die 1630. For example, in one embodiment, the width dimensionl 699 of the aperture 1615 may be made at least four times the width dimension 1697 of the light source die 1630.

Figure 16E:
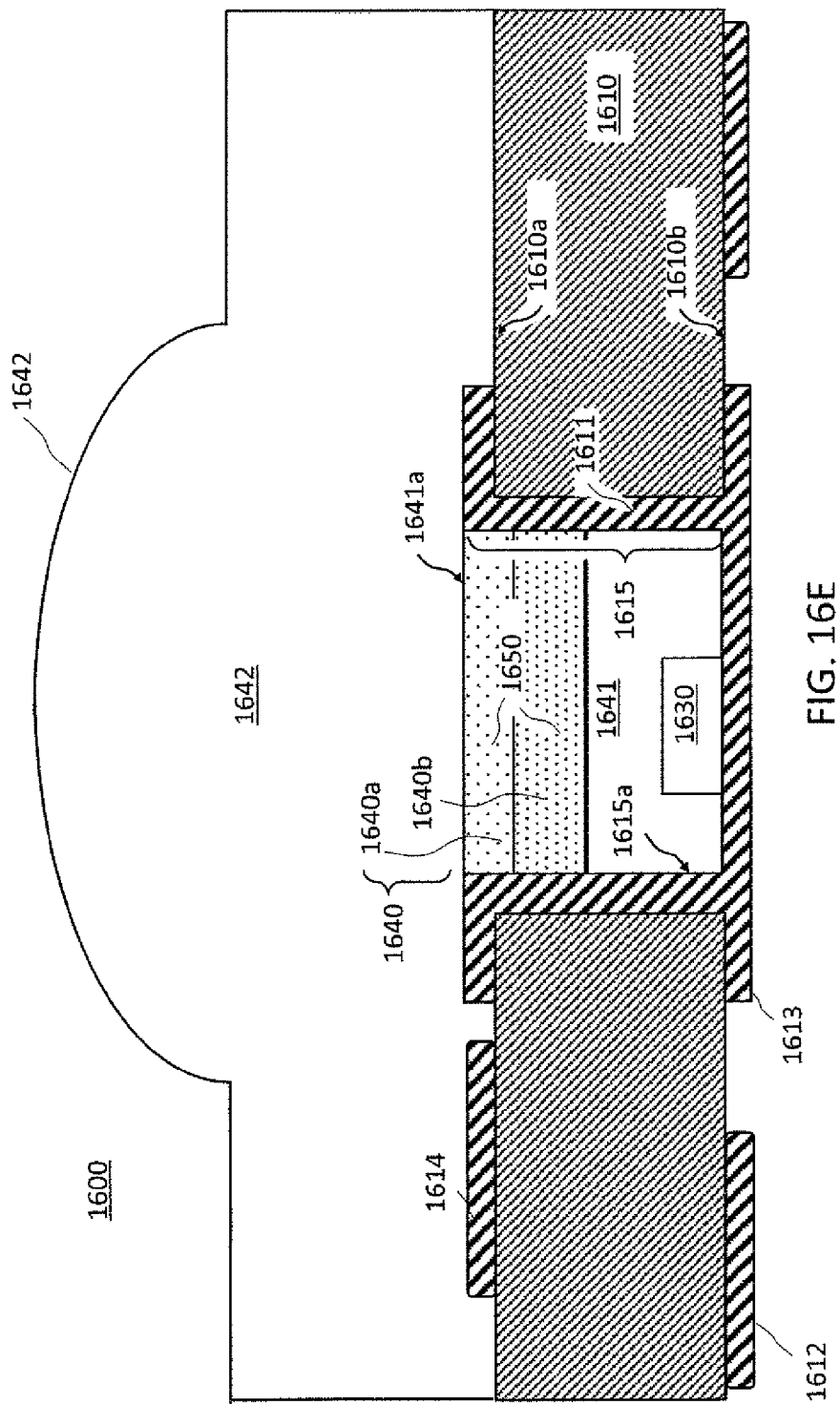

An additional optical coupling layer 1642 may be formed to cover the second surface 1610*a* of the substrate 1610 as shown in FIG. 16E. The additional optical coupling layer 1642 may be formed substantially planarly parallel to the second surface 1610*a* of the substrate 1610. The additional optical coupling layer 1642 may be disposed on the second surface 1610*a* of the substrate 1610 and may be configured to transmit light. A portion of the additional optical coupling layer 1642 may define an optical lens 1643. The optical lens 1643 may be configured to collimate or to focus light to a specific direction.

The additional optical coupling layer 1642 and the optical coupling layer 1641 may be made from similar or substantially similar encapsulant such as epoxy, silicone or any other suitable material. The wavelength converting layer 1640 may be made from similar or substantially similar material with the additional optical coupling layer 1642 and the optical coupling layer 1641 except that the wavelength converting layer 1640 may be mixed with a wavelength converting material 1650. Therefore, by using similar encapsulant material for the optical coupling layer 1641, the wavelength converting layer 1640 and the additional optical coupling layer 1642, light may be transmitted through the three layers 1640, 1641, 1642 without being refracted.

Figure 17:
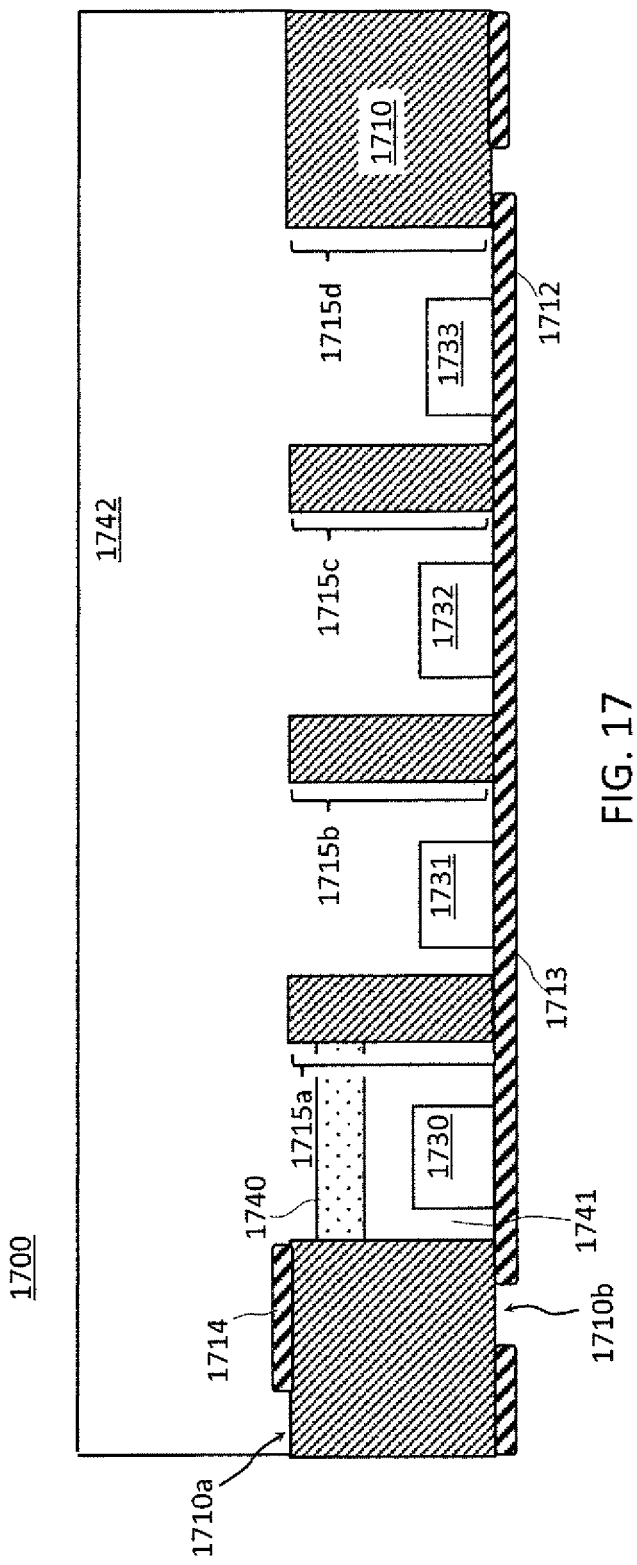
FIG. 17 illustrates a lighting apparatus with a substrate having a plurality of apertures.

The light-emitting devices 1500 and 1600 may form part of a flash system 1300 or part of a camera device as discussed in FIG. 13. In addition, the light-emitting devices 1500 and 1600 may be used in lighting apparatus for solid-state lighting. For solid-state lighting, it may be desirable to have a plurality of light source dies to improve color rendering index of the lighting apparatus. This is shown in FIG. 17. FIG. 17 illustrates an embodiment of a cross-sectional view of a lighting apparatus 1700 comprising a substrate 1710 having a first surface 1710*b* (or a bottom surface 1710*b* in FIG. 17) and a second surface 1710*a* (or a top surface 1710*a* in FIG. 17), a plurality of conductors 1712-1714, a plurality of light source dies 1730-1733, an optical coupling layer 1741, a wavelength converting layer 1740 and an additional optical coupling layer 1742. The wavelength converting layer 1740 may comprise a low density layer (not shown) and a high density layer (not shown) as discussed earlier in previous embodiments.

The substrate 1710 may be a PCB, a flexible circuit, a ceramic substrate or any other similar structures having two opposite major surfaces, i.e. the first surface 1710*b* and the second surface 1710*a*. The substrate 1610 may be made from electrically insulating material such as BT-Epoxy, composite epoxy material CE-1,5, Cyanate Ester, FR-2, FR-4, Polyimide or Polytetrafluoroethylene used to make PCB; polyimide used to make flexible circuit; and aluminum oxide or aluminum nitride used to make ceramic substrate.

The substrate 1710 may comprise a plurality of apertures 1715*a*, 1715*b*, 1715*c*, 1715*d*. Similar to illustration of previous embodiments, a drill process, for example a laser drill process may be employed to form the aperture 1715, which may provide a drilled aperture 1715*a*, 1715*b*, 1715*c*, 1715*d*. During the laser drill process, the drilling process may stop right before the die attach pad 1713 so that the die attach pad 1713 may be accessible from the top surface 1710*b*. Other processes such as mechanical drilling or etching may be employed but the die attach pad 1713 may be made thicker because part of the die attach pad 1713 may be etched or drilled away in the process. The drilled or etched aperture 1715*a*, 1715*b*, 1715*c*, 1715*d* will be referred hereinafter as aperture 1715*a*, 1715*b*, 1715*c*, 1715*d*.

The first light source die 1730 may be configured to emit a light that is converted into a white light or a broad spectrum light through the wavelength converting layer 1740. The wavelength converting layer 1740 and the first light source die 1730 may be disposed within a first aperture 1715a. The lighting apparatus 1700 may comprise a second light source die 1731 configured to emit a narrow band light having a color. The second light source die 1731 may be disposed within a second aperture 1715b distanced from the first aperture 1715a so that light emitted from the at least one more second light source die 1731 may not be transmitted through the wavelength converting layer 1740.

The lighting apparatus 1700 may comprise optional third and fourth light source dies 1732, 1733. The optional third and fourth light source dies 1732, 1733 may be configured to emit a light having different color from each other and having different color from the first and second light source dies 1730, 1731. The optional third and fourth light source dies 1732, 1733 may be disposed respectively in a third aperture 1715c and a fourth aperture 1715d as shown in FIG. 17. Alternatively, the second, third and fourth light source dies 1731, 1732,1733 may be disposed within one single aperture 1715b. As shown in FIG. 17, the second, third and fourth light source dies 1731, 1732,1733 may be encapsulated by the additional optical coupling layer 1742. The additional optical coupling layer 1742 may be configured to cover the wavelength converting layer 1740 and the second surface 1710a of the substrate 1710. In one embodiment, the second, third and fourth light source dies 1731, 1732, 1733 may be configured to emit red, blue and green light respectively.

Different aspects, embodiments or implementations may, but need not, yield one or more of the following advantages. For example, the height dimension of the low density layer and the high density layer may have design considerations and advantages in optical performance. Likewise, the width dimension of light source die relative to the width dimension of the aperture may have advantages as explained above.

Although specific embodiments of the invention have been described and illustrated herein above, the invention should not be limited to any specific forms or arrangements of parts so described and illustrated. For example, the light source die described above may be an LED die or some other future light source die. Likewise, although a light-emitting device with a single die was discussed, the light-emitting device may contain any number of dies, as known or later developed without departing from the spirit of the invention. The scope of the invention is to be defined by the claims appended hereto and their equivalents. Similarly, manufacturing embodiments and the steps thereof may be altered, combined, reordered, or other such modification as is known in the art to produce the results illustrated.

What is claimed is:

1. A light-emitting device, comprising:
   a substrate having opposing first and second surfaces;
   an aperture extending through the substrate from the first surface to the second surface of the substrate;
   a die attach pad configured to cover the aperture at the first surface;
   a light source die attached to the die attach pad;
   an optical coupling layer substantially encapsulating the light source die within the aperture;
   a wavelength converting layer formed on the optical coupling layer, wherein the wavelength converting layer comprises a low density layer and a high density layer; and
   a wavelength-converting material formed within the wavelength converting layer;
   wherein the high density layer has substantially higher density of the wavelength-converting material relative to the low density layer such that the wavelength converting material in the low density layer is suspended within the low density layer in particle form but the wavelength-converting material in the high density layer is precipitated on one side of wavelength converting layer.

2. The light-emitting device of claim 1 further comprising an additional optical coupling layer, wherein the wavelength converting layer is sandwiched between the optical coupling layer and the additional optical coupling layer.

3. The light-emitting device of claim 2, wherein the additional optical coupling layer is substantially planarly parallel to the second surface of the substrate.

4. The light-emitting device of claim 3, wherein the additional optical coupling layer covers entirely the second surface of the substrate.

5. The light-emitting device of claim 2, wherein the wavelength converting layer is formed within the aperture.

6. The light-emitting device of claim 5, wherein:
   the high density layer has a thickness and the low density layer has a thickness; and
   the thickness of the high density layer is at least more than the thickness of the low density layer.

7. The light-emitting device of claim 2, wherein the wavelength converting layer, the optical coupling layer and the additional optical coupling layer are formed using substantially the same type of encapsulant.

8. The light-emitting device of claim 1, wherein the high density layer of the wavelength converting layer covers entirely the second surface of the substrate.

9. The light-emitting device of claim 1, wherein the wavelength converting layer is formed adjacent to the second surface of the substrate and outside the aperture.

10. The light-emitting device of claim 9, wherein:
    the high density layer has a thickness and the low density layer has a thickness; and
    the thickness of the high density layer is less than approximately half of the thickness of the low density layer.

11. The light-emitting device of claim 1, wherein the light-emitting device forms a portion of a camera device.

12. The light-emitting device of claim 1, wherein the density of the wavelength-converting material in the high density layer is substantially higher than the low density layer such that the wavelength-converting material in the low density layer is distinguishably visible under a microscope but the wavelength-converting material in the high density layer is visually visible.

13. A flash system for use in a mobile device, comprising:
    a substrate having opposing first and second surfaces;
    a plurality of conductors being form on at least one of the first and second surfaces;
    an aperture extending through the substrate, from the first surface to the second surface of the substrate;
    a die attach pad extending over and covering the first surface of the substrate;
    a light source die attached on the die attach pad and disposed substantially within the aperture;
    an optical coupling layer encapsulating the light source die; and
    a wavelength converting layer comprising a low density layer and a high density layer disposed on the optical coupling layer such that the optical coupling layer is sandwiched between the wavelength converting layer and the die attach pad, wherein the high density layer has substantially higher density relative to the low density layer such that the low density layer is distinguishably visible under a microscope whereas the high density layer is visually visible precipitated particles on one side of the wavelength-converting material.

14. The flash system of claim 13, wherein the high density layer has a substantially uniform thickness.

15. The flash system of claim 13, wherein the wavelength converting layer is disposed within the aperture.

16. The flash system of claim 15, wherein the flash system further comprises an additional optical coupling layer disposed on the second surface of the substrate covering an opening of the aperture at the second surface of the substrate.

17. A lighting apparatus, comprising:
a substrate having a opposing first and second surfaces;
first and second apertures extending through the substrate from the first surface to the second surface of the substrate;
first and second die attach pads adjacent to the first surface of the substrate and substantially covering the first and second apertures;
a first light source die attached on the first die attach pad and disposed substantially within the first aperture for emitting light;
a second light source die attached on the second die attach pad and disposed substantially within the second aperture for emitting light;
a first optical coupling layer encapsulating the first light source die within the first aperture;
a wavelength converting layer formed on the first optical coupling layer but being confined within the first aperture, the wavelength converting layer being configured to cover the first light source die so as to convert the light emitted from the first light source die into a broader spectrum light; and
a second optical coupling layer encapsulating the second light source die, the wavelength converting layer that covers the first light source die and at least a portion of the second surface of the substrate such that the second optical coupling layer is configured to mix light emitted from the second light source die with the broader spectrum light from the wavelength converting layer.

18. The lighting apparatus of claim 17, wherein the wavelength converting layer comprises:
a low density layer of wavelength converting particles; and
a high density layer of the wavelength converting particles connected to the low density layer, wherein the high density layer has substantially higher concentration of the wavelength-converting particles relative to the low density layer such that the wavelength-converting particles in the high density layer is precipitated but the wavelength-converting particles in the low density layer is in particle form suspending within the low density layer.

19. The lighting apparatus of claim 18 further comprising a third light source die and a fourth light source die encapsulated by the second optical coupling layer, wherein light emitted by the third and fourth light source dies are mixed with the light emitted from the second light source die within the second optical coupling layer.

20. The lighting apparatus of claim 19, wherein:
the first light source die and the wavelength converting layer are configured to generate white light;
the second light source die is configured to generate light of a first color;
the third light source die is configured to generate red light of a second color; and
the fourth light source die is configured to generate light of a third color.

* * * * *